United States Patent
Ishitani et al.

(10) Patent No.: US 7,808,164 B2
(45) Date of Patent: Oct. 5, 2010

(54) DISPLAY DEVICE

(75) Inventors: Tetsuji Ishitani, Kanagawa (JP); Yuji Egi, Kanagawa (JP); Takeshi Nishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/612,669

(22) Filed: Dec. 19, 2006

(65) Prior Publication Data

US 2007/0159044 A1 Jul. 12, 2007

(30) Foreign Application Priority Data

Dec. 22, 2005 (JP) ............................ 2005-369537

(51) Int. Cl.
    *H01J 5/16* (2006.01)
(52) U.S. Cl. .................. 313/112; 359/483; 313/498
(58) Field of Classification Search ......... 313/498–512, 313/110–112; 345/87–104; 315/169.1, 169.3; 438/26–29, 34, 82; 428/690–691, 917; 257/40, 257/72, 98–100, 642–643, 759; 427/58, 427/64, 66, 532–535, 539; 445/24–25; 359/483
    See application file for complete search history.

(56) References Cited

U.S. PATENT DOCUMENTS

| | | | |
|---|---|---|---|
| 4,769,242 A | 9/1988 | Shibanai |
| 4,769,292 A | 9/1988 | Tang et al. |
| 4,968,120 A | 11/1990 | Depp et al. |
| 5,283,132 A | 2/1994 | Ogura et al. |
| 5,305,143 A | 4/1994 | Taga et al. |
| 5,396,406 A | 3/1995 | Ketchpel |
| 5,583,677 A | 12/1996 | Ito et al. |
| 5,856,819 A | 1/1999 | Vossler |
| 6,011,580 A | 1/2000 | Hattori et al. |

(Continued)

FOREIGN PATENT DOCUMENTS

EP          0 365 778          5/1990

(Continued)

OTHER PUBLICATIONS

International Search Report (Application No. PCT/JP2006/325145); Mar. 20, 2007; 3 pages.

(Continued)

*Primary Examiner*—Peter J Macchiarolo
*Assistant Examiner*—Donald L Raleigh
(74) *Attorney, Agent, or Firm*—Fish & Richardson P.C.

(57) ABSTRACT

A display device having an electroluminescence element with an improved contrast ratio is provided. Stacked polarizing plates are provided on the outer side of substrates of a display device which includes a first light-transmitting substrate and a second light-transmitting substrate arranged to face each other and an electroluminescence element interposed therebetween that emits light to both the first light-transmitting substrate side and the second light-transmitting substrate side. The polarizing plates facing each other are arranged in a crossed nicol state. Furthermore, among a plurality of polarizing plates arranged to face each other, a plurality of polarizing plates which are stacked on one side or the other side of the light-transmitting substrates are arranged in a parallel nicol state. As a result, a display device with a high contrast ratio can be provided.

20 Claims, 12 Drawing Sheets

U.S. PATENT DOCUMENTS

| | | | |
|---|---|---|---|
| 6,023,317 A | 2/2000 | Xu et al. | |
| 6,097,147 A | 8/2000 | Baldo et al. | |
| 6,291,255 B1 | 9/2001 | Huang et al. | |
| 6,356,029 B1 | 3/2002 | Hunter | |
| 6,445,005 B1 | 9/2002 | Yamazaki et al. | |
| 6,577,361 B1 | 6/2003 | Sekiguchi et al. | |
| 6,583,770 B1 | 6/2003 | Antila et al. | |
| 6,621,508 B1 | 9/2003 | Shiraishi et al. | |
| 6,646,698 B2 | 11/2003 | Mori | |
| 6,656,608 B1 | 12/2003 | Kita et al. | |
| 6,657,260 B2 | 12/2003 | Yamazaki et al. | |
| 6,689,492 B1 | 2/2004 | Yamazaki et al. | |
| 6,706,339 B1 | 3/2004 | Miyatake et al. | |
| 6,762,436 B1 | 7/2004 | Huang et al. | |
| 6,765,721 B2 | 7/2004 | Kawazu et al. | |
| 6,774,877 B2 | 8/2004 | Nishitoba et al. | |
| 6,778,229 B2 | 8/2004 | Inoue et al. | |
| 6,784,457 B2 | 8/2004 | Yamazaki et al. | |
| 6,830,828 B2 | 12/2004 | Thompson et al. | |
| 6,863,997 B2 | 3/2005 | Thompson et al. | |
| 6,869,695 B2 | 3/2005 | Thompson et al. | |
| 6,872,472 B2 | 3/2005 | Liao et al. | |
| 6,887,592 B2 | 5/2005 | Hieda et al. | |
| 6,893,743 B2 | 5/2005 | Sato et al. | |
| 6,894,312 B2 | 5/2005 | Yamazaki et al. | |
| 6,897,916 B2 | 5/2005 | Hamamoto | |
| 6,911,271 B1 | 6/2005 | Lamansky et al. | |
| 6,939,624 B2 | 9/2005 | Lamansky et al. | |
| 6,942,931 B2 | 9/2005 | Lee et al. | |
| 6,951,694 B2 | 10/2005 | Thompson et al. | |
| 6,970,144 B1 | 11/2005 | Swift et al. | |
| 6,970,218 B2 | 11/2005 | Fukuda et al. | |
| 6,995,816 B2 | 2/2006 | Mi et al. | |
| 6,998,772 B2 | 2/2006 | Terumoto | |
| 7,015,990 B2 | 3/2006 | Yeh et al. | |
| 7,034,451 B2 | 4/2006 | Senbonmatsu | |
| 7,057,682 B2 | 6/2006 | Watson et al. | |
| 7,059,718 B2 | 6/2006 | Masterson | |
| 7,060,370 B2 | 6/2006 | Kinoshita et al. | |
| 7,060,371 B2 | 6/2006 | Akiyama et al. | |
| 7,064,740 B2 | 6/2006 | Daly | |
| 7,139,053 B2 | 11/2006 | Yuuki et al. | |
| 7,144,608 B2 | 12/2006 | Paukshto et al. | |
| 7,148,502 B2 | 12/2006 | Yamazaki et al. | |
| 7,161,185 B2 | 1/2007 | Yamazaki et al. | |
| 7,161,649 B2 | 1/2007 | Lee et al. | |
| 7,175,898 B2 | 2/2007 | Lühmann et al. | |
| 7,211,823 B2 | 5/2007 | Tung et al | |
| 7,218,365 B2 | 5/2007 | Chang et al. | |
| 7,327,335 B2 | 2/2008 | Yamazaki et al. | |
| 7,375,464 B2 * | 5/2008 | Chin et al. | 313/506 |
| 7,381,479 B2 | 6/2008 | Lamansky et al. | |
| 2001/0048405 A1 | 12/2001 | Salley | |
| 2002/0025419 A1 | 2/2002 | Lee et al. | |
| 2002/0027416 A1 | 3/2002 | Kim et al. | |
| 2002/0093284 A1 | 7/2002 | Adachi et al. | |
| 2002/0113546 A1 | 8/2002 | Seo et al. | |
| 2002/0140343 A1 | 10/2002 | Hirabayashi | |
| 2002/0159003 A1 | 10/2002 | Sato et al. | |
| 2002/0186469 A1 | 12/2002 | Kawazu et al. | |
| 2003/0017361 A1 | 1/2003 | Thompson et al. | |
| 2003/0053011 A1 | 3/2003 | Mori | |
| 2003/0054199 A1 | 3/2003 | Oh | |
| 2003/0057419 A1 | 3/2003 | Murakami et al. | |
| 2003/0063456 A1 | 4/2003 | Katahira | |
| 2003/0103022 A1 | 6/2003 | Noguchi et al. | |
| 2003/0129452 A1 | 7/2003 | Tsuji et al. | |
| 2003/0210360 A1 | 11/2003 | Yoshida | |
| 2004/0141122 A1 | 7/2004 | Nakagawa | |
| 2004/0144974 A1 | 7/2004 | Lee et al. | |
| 2004/0151829 A1 | 8/2004 | Boroson et al. | |
| 2004/0169461 A1 | 9/2004 | Moriyama et al. | |
| 2004/0169624 A1 | 9/2004 | Yamazaki et al. | |
| 2004/0183082 A1 | 9/2004 | Yamazaki | |
| 2004/0195965 A1 * | 10/2004 | Yamazaki et al. | 313/506 |
| 2004/0201341 A1 | 10/2004 | Miyachi et al. | |
| 2004/0202893 A1 | 10/2004 | Abe | |
| 2004/0227698 A1 | 11/2004 | Yamazaki et al. | |
| 2004/0239658 A1 | 12/2004 | Koyama et al. | |
| 2004/0245529 A1 | 12/2004 | Yamazaki et al. | |
| 2004/0251823 A1 * | 12/2004 | Park et al. | 313/506 |
| 2004/0257497 A1 | 12/2004 | Paukshto et al. | |
| 2004/0262576 A1 | 12/2004 | Thompson et al. | |
| 2004/0263056 A1 | 12/2004 | Seo et al. | |
| 2004/0263066 A1 | 12/2004 | Abe et al. | |
| 2004/0263069 A1 | 12/2004 | Yamazaki et al. | |
| 2005/0012686 A1 | 1/2005 | Osame et al. | |
| 2005/0024339 A1 | 2/2005 | Yamazaki et al. | |
| 2005/0077817 A1 | 4/2005 | Yamazaki et al. | |
| 2005/0093438 A1 * | 5/2005 | Chen | 313/506 |
| 2005/0100660 A1 | 5/2005 | Ito et al. | |
| 2005/0123791 A1 | 6/2005 | Deaton et al. | |
| 2005/0127820 A1 | 6/2005 | Yamazaki et al. | |
| 2005/0157225 A1 | 7/2005 | Toyooka et al. | |
| 2005/0157255 A1 | 7/2005 | Masterson | |
| 2005/0162092 A1 | 7/2005 | Yamazaki et al. | |
| 2005/0179835 A1 | 8/2005 | Lee et al. | |
| 2005/0202278 A1 | 9/2005 | Mishima et al. | |
| 2005/0253789 A1 | 11/2005 | Ikeda | |
| 2006/0007376 A1 | 1/2006 | Fukuda et al. | |
| 2006/0024526 A1 | 2/2006 | Thompson et al. | |
| 2006/0055847 A1 * | 3/2006 | Yamazaki et al. | 349/106 |
| 2006/0114375 A1 | 6/2006 | Yeh et al. | |
| 2006/0114384 A1 | 6/2006 | Yeh et al. | |
| 2006/0158096 A1 * | 7/2006 | Adachi et al. | 313/501 |
| 2006/0164571 A1 | 7/2006 | Broer et al. | |
| 2006/0215096 A1 | 9/2006 | Iwamoto et al. | |
| 2007/0120475 A1 | 5/2007 | Ishitani et al. | |
| 2007/0121033 A1 | 5/2007 | Ishitani et al. | |
| 2007/0126962 A1 | 6/2007 | Egi et al. | |
| 2007/0146579 A1 | 6/2007 | Egi et al. | |
| 2007/0146580 A1 | 6/2007 | Ishitani et al. | |
| 2007/0177071 A1 | 8/2007 | Egi et al. | |
| 2007/0177084 A1 | 8/2007 | Ishitani et al. | |
| 2007/0177086 A1 | 8/2007 | Ishitani et al. | |
| 2007/0182885 A1 | 8/2007 | Egi et al. | |
| 2007/0200977 A1 | 8/2007 | Egi et al. | |
| 2007/0200978 A1 | 8/2007 | Ishitani et al. | |
| 2009/0179549 A1 | 7/2009 | Abe et al. | |

FOREIGN PATENT DOCUMENTS

| | | |
|---|---|---|
| EP | 1 152 282 A1 | 11/2001 |
| JP | 62-206524 | 9/1987 |
| JP | 64-082014 | 3/1989 |
| JP | 03-257429 | 11/1991 |
| JP | 05-034731 | 2/1993 |
| JP | 05-100114 | 4/1993 |
| JP | 06-222357 | 8/1994 |
| JP | 07-142170 | 6/1995 |
| JP | 07-181476 | 7/1995 |
| JP | 2761453 | 6/1998 |
| JP | 10-255976 | 9/1998 |
| JP | 2000-180843 | 6/2000 |
| JP | 2000-249832 | 9/2000 |
| JP | 3174367 | 6/2001 |
| JP | 2001-242320 | 9/2001 |
| JP | 2002-277867 | 9/2002 |
| JP | 2003-172819 | 6/2003 |
| JP | 2003279963 A * | 10/2003 |
| JP | 2004-354818 | 12/2004 |
| WO | WO00/34821 | 6/2000 |

| WO | WO 2004/036272 | 4/2004 |

OTHER PUBLICATIONS

International Searching Authority Written Opinion (Application No. PCT/JP2006/325145), Mar. 20, 2007, 3 pages.

Pavel Lazarev et al.; "P-116: Thin Crystal Films (TCF) for LCD Contrast Enhancement"; *SID Digest '03 : SID International Symposium Digest of Technical Papers*, pp. 669-671 (2003).

J. Chen at al.; "21.2: Optimum Film Compensation Modes for TN and VA LCDs"; *SID Digest '98 : SID International Symposium Digest of Technical Papers*, pp. 315-318 (1998).

* cited by examiner

DISPLAY DEVICE

TECHNICAL FIELD

The present invention relates to a configuration of a display device for improving a contrast ratio.

BACKGROUND ART

A display device which is very thin and lightweight as compared to the conventional cathode-ray tube display device, a so-called flat panel display, has been developed. A liquid crystal display device having a liquid crystal element as a display element, a display device having a self-luminous element, an FED (field emission display) using an electron source, and the like compete in the market of flat panel displays. Therefore, lower power consumption and a higher contrast are required in order to increase the added value and differentiate from other products.

A general liquid crystal display device is provided with one polarizing plate over each of the substrates so as to improve a contrast ratio. By darkening black display, the contrast ratio can be improved. Therefore, higher display quality can be provided when an image is seen in a dark room such as a home theater room.

For example, it is suggested that a first polarizing plate is provided on the outer side of a substrate on a viewing side of a liquid crystal cell, a second polarizing plate is provided on the outer side of another substrate facing the substrate on the viewing side, and a third polarizing plate is provided for heightening the polarization degree when light from an auxiliary light source provided on the substrate side is polarized through the second polarizing plate and passes the liquid crystal cell, in order to improve a contrast ratio (see Patent Document 1: PCT International Publication No. 00/34821). As a result, improvements in nonuniformity of display caused by an insufficient polarization degree and polarization degree distribution of the polarizing plate, and in the contrast ratio are realized.

As a flat panel display similar to a liquid crystal display device, there is a display device having an electroluminescence element. The electroluminescence element is a self-luminous element which requires no light irradiation means such as a backlight; therefore, a display device using it can be made thin. In addition, compared to a liquid crystal display device, the display device using the electroluminescence element has merits such as high response speed and less view angle dependence.

A structure in which a polarizing plate or a circularly polarizing plate is provided for a display device having such an electroluminescence element is proposed (see Patent Documents 2 and 3: Japanese Patent No. 2761453 and Japanese Patent No. 3174367).

Furthermore, as a structure of a display device having an electroluminescence element, a structure in which light emitted from a light emitting element interposed between light-transmitting substrates can be observed as light of an anode substrate side and light of a cathode substrate side is proposed (see Patent Document 4: Japanese Published Patent Application No. H10-255976).

DISCLOSURE OF INVENTION

However, an improvement in contrast ratio is required for not only a liquid crystal display device but also for a display device having an electroluminescence element. An electroluminescence element which can be observed from both sides of the display particularly requires a light contrast in a bright place such as under external light.

In view of the above-described issue, a feature of the present invention is to provide a plurality of polarizing plates over each of light-transmitting substrates arranged to face each other. The plurality of polarizing plates may have a staked structure.

The polarizing plates facing each other with the light-transmitting substrates therebetween are arranged in a crossed nicol state. In addition, the plurality of polarizing plates that are stacked over one of the light-transmitting substrates are arranged in a parallel nicol state. Here, crossed nicol means an arrangement where transmission axes of a pair of polarizing plates are off from each other by 90°. Parallel nicol means an arrangement where transmission axes of a pair of polarizing plates are off from each other by 0°. It is to be noted that a polarizing plate has an absorption axis that is orthogonal to a transmission axis, and cross nicol and parallel nicol can be defined using the absorption axis as well.

One feature of a display device of the present invention is to include: a first light-transmitting substrate and a second light-transmitting substrate arranged to face each other; a light emitting element interposed between the first light-transmitting substrate and the second light-transmitting substrate facing each other, which emits light to both the first light-transmitting substrate side and the second light-transmitting substrate side; stacked first linear polarizing plates arranged on the outer side of the first light-transmitting substrate; and stacked second linear polarizing plates arranged on the outer side of the second light-transmitting substrate.

Another feature of a display device of the present invention is to include: a first light-transmitting substrate and a second light-transmitting substrate arranged to face each other; a light emitting element interposed between the first light-transmitting substrate and the second light-transmitting substrate facing each other, which emits light to both the first light-transmitting substrate side and the second light-transmitting substrate side; stacked first linear polarizing plates arranged on the outer side of the first light-transmitting substrate; and stacked second linear polarizing plates arranged on the outer side of the second light-transmitting substrate. The stacked first linear polarizing plates are arranged such that transmission axes thereof are in a parallel nicol state, and the stacked second linear polarizing plates are arranged such that transmission axes thereof are in a parallel nicol state.

Another feature of a display device of the present invention is to include: a first light-transmitting substrate and a second light-transmitting substrate arranged to face each other; a light emitting element interposed between the first light-transmitting substrate and the second light-transmitting substrate facing each other, which emits light to both the first light-transmitting substrate side and the second light-transmitting substrate side; stacked first linear polarizing plates arranged on the outer side of the first light-transmitting substrate; and stacked second linear polarizing plates arranged on the outer side of the second light-transmitting substrate. The stacked first linear polarizing plates are arranged such that transmission axes thereof are in a parallel nicol state, the stacked second linear polarizing plates are arranged such that transmission axes thereof are in a parallel nicol state, and the transmission axes of the stacked first linear polarizing plates and the transmission axes of the stacked second linear polarizing plates are in a crossed nicol state.

Another feature of a display device of the present invention is to include: a first light-transmitting substrate and a second light-transmitting substrate arranged to face each other; a light emitting element interposed between the first light-transmitting substrate and the second light-transmitting substrate facing each other, which emits light to both the first light-transmitting substrate side and the second light-transmitting substrate side; stacked first linear polarizing plates arranged on the outer side of the first light-transmitting substrate; and a second linear polarizing plate arranged on the outer side of the second light-transmitting substrate. The stacked first linear polarizing plates are arranged such that transmission axes thereof are in a parallel nicol state, and the transmission axes of the stacked first linear polarizing plates and a transmission axis of the second linear polarizing plate are in a crossed nicol state.

In the present invention, the first linear polarizing plates may be provided so as to be in contact with each other, and the second linear polarizing plates may be provided so as to be in contact with each other.

Furthermore, in the present invention, the display element is a light emitting element. As the light emitting element, there are an element utilizing electroluminescence (an electroluminescence element), an element utilizing plasma, and an element utilizing field emission. The electroluminescence element can be divided into an organic EL element and an inorganic EL element, depending on a material to be used. A display device having such a light emitting element can be referred to as a light emitting device.

By using a simple structure in which a plurality of polarizing plates are provided, a contrast ratio of a display device having a light emitting element can be improved.

BEST MODE FOR CARRYING OUT THE INVENTION

Figure 1A:
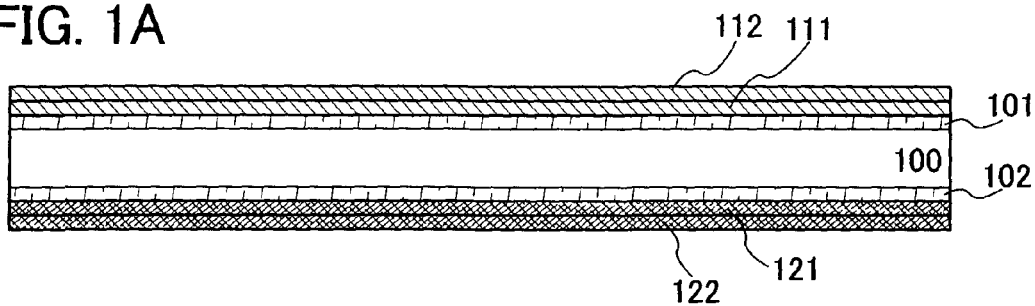
FIGS. 1A and 1B are views each showing a display device of the present invention.

Hereinafter, Embodiment Modes of the present invention will be described with reference to the drawings. However, the present invention can be implemented in various ways, and it is to be easily understood by those skilled in the art that the modes and details can be changed in various ways without departing from the spirit and scope of the present invention. Therefore, the present invention is not interpreted as being limited to the following description of Embodiment Modes. It is to be noted that, in all the drawings for explaining Embodiment Modes, the same portions and portions having the same functions are denoted by the same reference numerals, and repeated explanation thereof will be omitted.

Embodiment Mode 1

In this embodiment mode, a concept of a display device of the present invention will be described. In this embodiment mode, the explanation will be made using an electroluminescence element as a light emitting element.

Figure 1B:
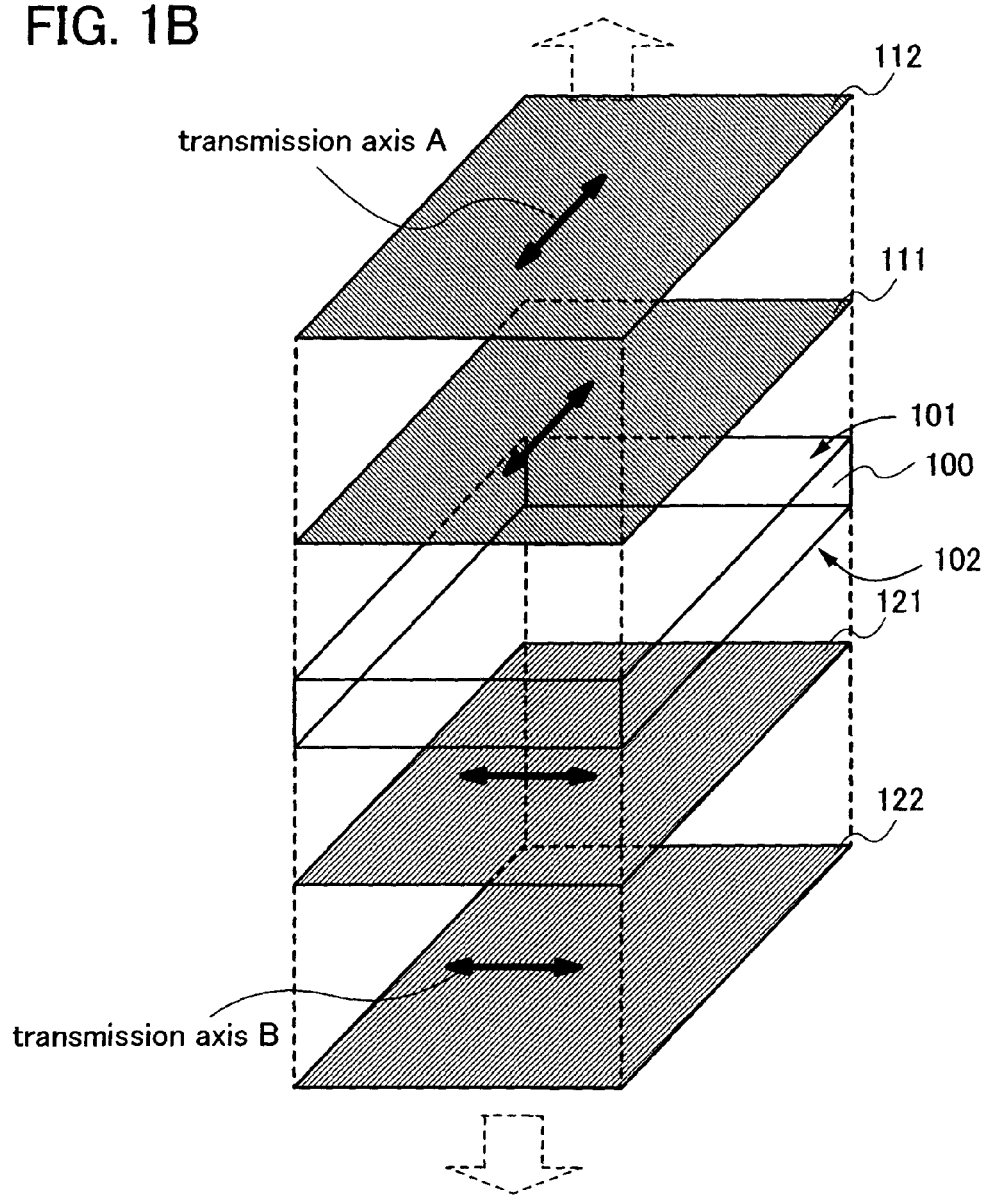

As shown in FIGS. 1A and 1B, a layer 100 having an electroluminescence element is interposed between a first light-transmitting substrate 101 and a second light-transmitting substrate 102 that are arranged so as to face each other. FIG. 1A is a cross-sectional view of the display device of the present invention, and FIG. 1B is a perspective view of the display device of the present invention.

In FIG. 1B, light from the electroluminescence element can be emitted to the first light-transmitting substrate 101 side and the second light-transmitting substrate 102 side (directions of dotted arrows). As the light-transmitting substrate, a glass substrate such as a barium borosilicate glass substrate or an alumino borosilicate glass substrate, a quartz substrate, or the like can be used. In addition, a substrate formed from a flexible synthetic resin such as plastic typified by polyethylene terephthalate (PET), polyethylene naphthalate (PEN), and polyether sulfone (PES), or acrylic can be used.

On the outer sides of the first light-transmitting substrate 101 and the second light-transmitting substrate 102, that is, on the sides not in contact with the layer 100 having the electroluminescence element, stacked polarizing plates are provided. Light emitted from the electroluminescence element is linearly polarized by the polarizing plates. In other words, the stacked polarizing plates can be referred to as stacked linear polarizing plates. "The stacked polarizing plates" indicates a condition where two or more polarizing plates are stacked. In this embodiment mode, a display device in which two polarizing plates are stacked is explained as an example, and the two polarizing plates are stacked so as to be in contact with each other as shown in FIG. 1A.

On the outer side of the first light-transmitting substrate 101, a first polarizing plate A 111 and a second polarizing plate A 112 are sequentially provided. The first polarizing plate A 111 and the second polarizing plate A 112 are arranged such that a transmission axis A of the first polarizing plate A 111 and a transmission axis A of the second polarizing plate A 112 are parallel to each other. In other words, the stacked polarizing plates, the first polarizing plate A 111 and the second polarizing plate A 112, are arranged such that the transmission axes thereof are in a parallel nicol state.

On the outer side of the second light-transmitting substrate 102, a first polarizing plate B 121 and a second polarizing plate B 122 are sequentially provided. The first polarizing plate B 121 and the second polarizing plate B 122 are arranged such that a transmission axis B of the first polarizing plate B 121 and a transmission axis B of the second polarizing plate B 122 are parallel to each other. In other words, the stacked polarizing plates, the first polarizing plate B 121 and the second polarizing plate B 122, are arranged such that the transmission axes thereof are in a parallel nicol state.

Furthermore, the transmission axes A of the stacked polarizing plates provided on the first light-transmitting substrate 101 and the transmission axes B of the stacked polarizing plates provided on the second light-transmitting substrate 102 cross at right angles. In other words, the stacked polarizing plates A and the stacked polarizing plates B, which face each other, are arranged such that the transmission axes thereof are in a crossed nicol state.

These polarizing plates can be formed using a known material, and a structure in which an adhesion surface, TAC (triacetylcellulose), a mixed layer of PVA (polyvinyl alcohol) and iodine, and TAC are stacked in this order from the substrate side may be used, for example. The polarization degree can be controlled by the mixed layer of PVA (polyvinyl alcohol) and iodine. The polarizing plate may be referred to as a polarizing film because of its shape.

It is to be noted that the polarizing plate has an absorption axis that is orthogonal to the transmission axis, as a characteristic of the polarizing plate. Therefore, when the absorption axes are parallel to each other, it can be referred to as "parallel nicol".

As described above, the polarizing plates are arranged such that the transmission axes of polarizing plates stacked on one another are in a parallel nicol state, and that the transmission axes of polarizing plates facing each other are in a crossed nicol state. A structure having polarizing plates stacked in this manner can reduce light leakage, compared to a structure in which just a pair of single-layer polarizing plates are arranged in a crossed nicol state. Therefore, the contrast ratio of the display device can be improved.

This embodiment mode can be implemented by being freely combined with the description in the other embodiment modes and embodiments in this specification.

Embodiment Mode 2

In this embodiment mode, a concept of a display device using stacked polarizing plates and a single polarizing plate will be described.

Figure 2A:
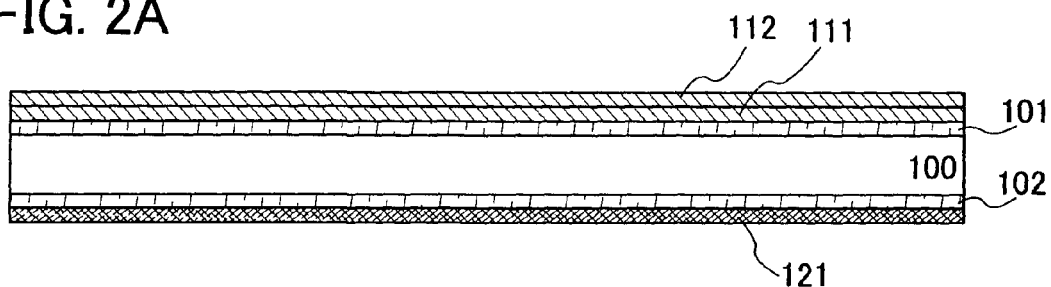
FIGS. 2A and 2B are views each showing a display device of the present invention.
Figure 2B:
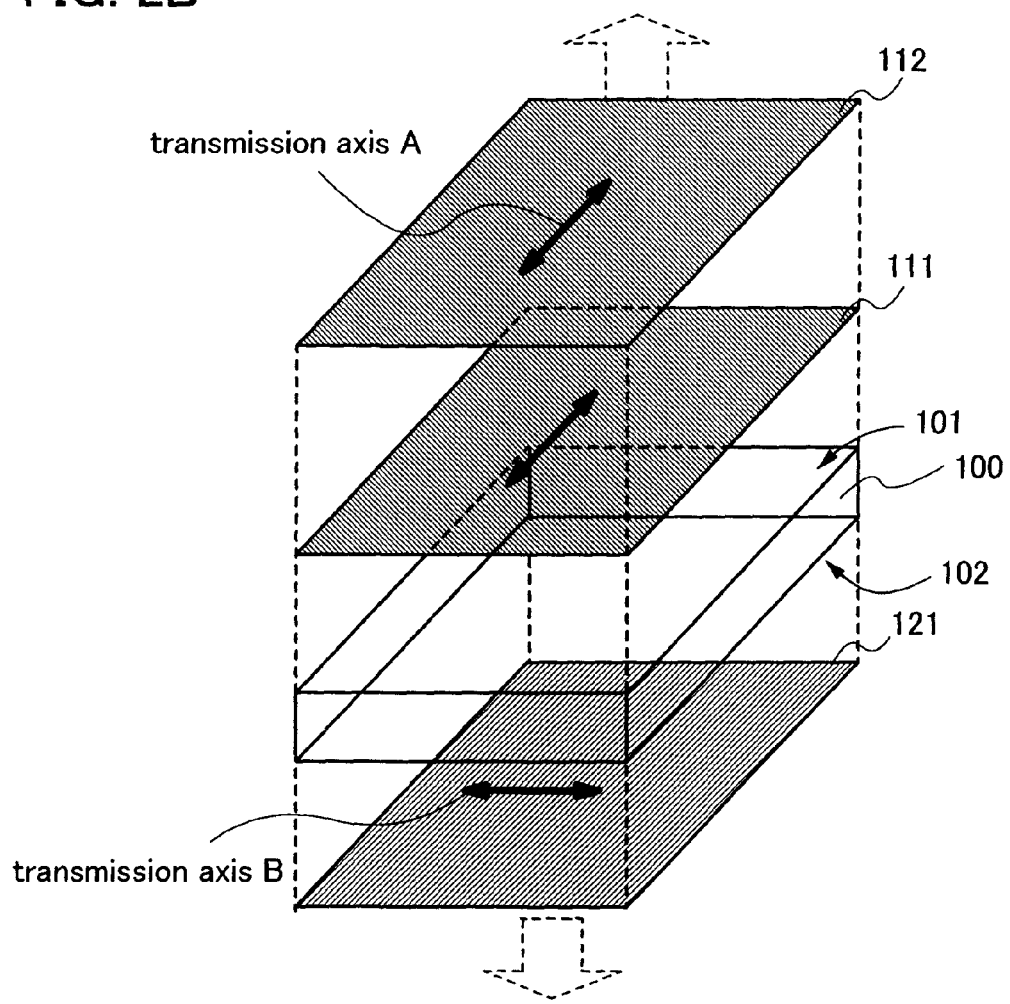

As shown in FIGS. 2A and 2B, a layer 100 having an electroluminescence element is interposed between a first light-transmitting substrate 101 and a second light-transmitting substrate 102 that are arranged so as to face each other. FIG. 2A is a cross-sectional view of the display device of the present invention, and FIG. 2B is a perspective view of the display device of the present invention.

In FIG. 2B, light from the electroluminescence element can be emitted to the first light-transmitting substrate 101 side and the second light-transmitting substrate 102 side (directions of dotted arrows). As the light-transmitting substrate, a glass substrate such as a barium borosilicate glass substrate or an alumino borosilicate glass substrate, a quartz substrate, or the like can be used. In addition, a substrate formed from a flexible synthetic resin such as plastic typified by polyethylene terephthalate (PET), polyethylene naphthalate (PEN), and polyether sulfone (PES), or acrylic can be used.

On the outer sides of the first light-transmitting substrate 101 and the second light-transmitting substrate 102, that is, on the sides not in contact with the layer 100 having the electroluminescence element, stacked polarizing plates and a polarizing plate with a single-layer structure are provided. Light emitted from the electroluminescence element is linearly polarized by the polarizing plates. In other words, the stacked polarizing plates can be referred to as stacked linear polarizing plates. "The stacked polarizing plates" indicates a condition where two or more polarizing plates are stacked. "The polarizing plate with a single-layer structure" indicates a condition where one polarizing plate is provided. In this embodiment mode, a display device in which two polarizing plates are stacked on one side where light is emitted and a polarizing plate with a single-layer structure is provided on the other side where light is emitted is explained as an example. The stacked two polarizing plates are stacked so as to be in contact with each other as shown in FIG. 2A.

On the outer side of the first light-transmitting substrate 101, a first polarizing plate A 111 and a second polarizing plate A 112 are sequentially provided. The first polarizing plate A 111 and the second polarizing plate A 112 are arranged such that a transmission axis A of the first polarizing plate A 111 and a transmission axis A of the second polarizing plate A 112 are parallel to each other. In other words, the stacked polarizing plates, the first polarizing plate A 111 and the second polarizing plate A 112, are arranged such that the transmission axes thereof are in a parallel nicol state.

On the outer side of the second light-transmitting substrate 102, a first polarizing plate B 121 is provided.

Furthermore, the transmission axes A of the stacked polarizing plates provided on the first light-transmitting substrate 101 and the transmission axis B of the polarizing plate with a single-layer structure provided on the second light-transmitting substrate 102 cross at right angles. In other words, the stacked polarizing plates A and the polarizing plate B with a single-layer structure, which face each other, are arranged such that the transmission axes thereof are in a crossed nicol state.

These polarizing plates can be formed using a known material, and a structure in which an adhesion surface, TAC (triacetylcellulose), a mixed layer of PVA (polyvinyl alcohol) and iodine, and TAC are stacked in this order from the substrate side may be used, for example. The polarization degree can be controlled by the mixed layer of PVA (polyvinyl alcohol) and iodine. The polarizing plate may be referred to as a polarizing film because of its shape.

It is to be noted that the polarizing plate has an absorption axis that is orthogonal to the transmission axis, as a characteristic of the polarizing plate. Therefore, when the absorption axes are parallel to each other, it can be referred to as "parallel nicol".

As described above, among the polarizing plates arranged so as to face each other, polarizing plates on one side or the other side are stacked on one another, and the facing polarizing plates are arranged such that the transmission axes thereof are in a crossed nicol state. In this manner as well, light leakage in the transmission axis direction can be reduced. As a result, the contrast ratio of the display device can be improved.

This embodiment mode can be implemented by being freely combined with the description in the other embodiment modes and embodiments in this specification.

Embodiment Mode 3

In this embodiment mode, a concept of a display device having the increased number of polarizing plates facing each other, that is, three or more polarizing plates stacked on each side, will be described.

Figure 3A:
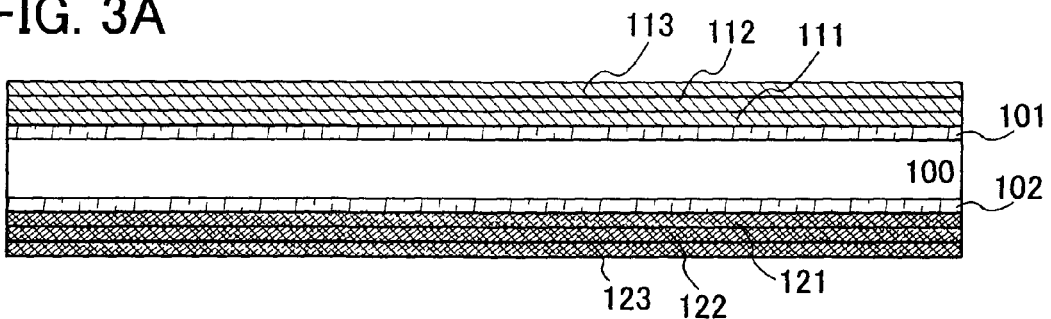
FIGS. 3A and 3B are views each showing a display device of the present invention.
Figure 3B:
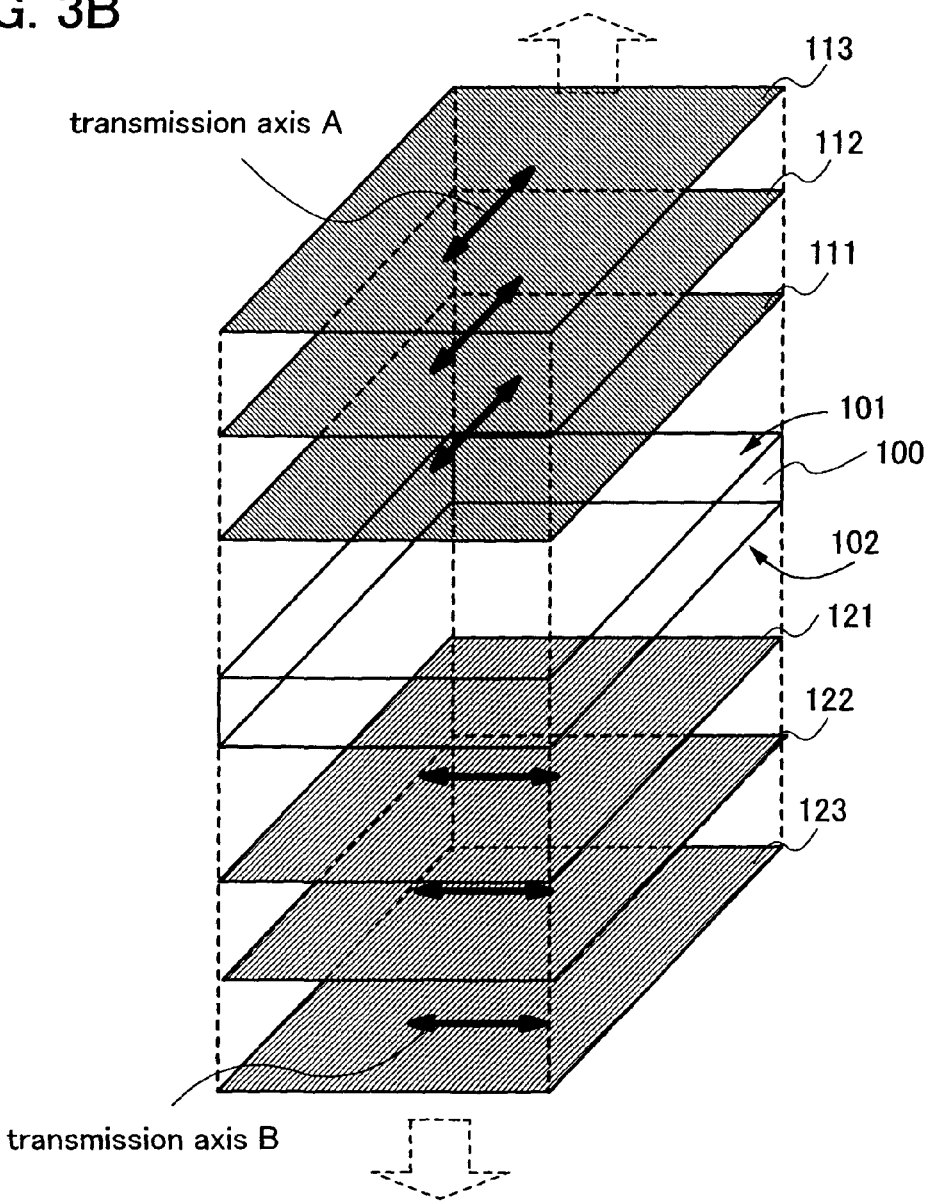

As shown in FIGS. 3A and 3B, a layer 100 having an electroluminescence element is interposed between a first light-transmitting substrate 101 and a second light-transmitting substrate 102 that are arranged so as to face each other. FIG. 3A is a cross-sectional view of the display device of the present invention, and FIG. 3B is a perspective view of the display device of the present invention.

In FIG. 3B, light from the electroluminescence element can be emitted to the first light-transmitting substrate 101 side and the second light-transmitting substrate 102 side (directions of dotted arrows). As the light-transmitting substrate, a glass substrate such as a barium borosilicate glass substrate or an alumino borosilicate glass substrate, a quartz substrate, or the like can be used. In addition, a substrate formed from a flexible synthetic resin such as plastic typified by polyethylene terephthalate (PET), polyethylene naphthalate (PEN), and polyether sulfone (PES), or acrylic can be used.

On the outer sides of the first light-transmitting substrate 101 and the second light-transmitting substrate 102, that is, on the sides not in contact with the layer 100 having the electroluminescence element, stacked polarizing plates are provided. Light emitted from the electroluminescence element is linearly polarized by the polarizing plates. In other words, the stacked polarizing plates can be referred to as stacked linear polarizing plates. "The stacked polarizing plates" indicates a condition where two or more polarizing plates are stacked. In this embodiment mode, a display device in which three polarizing plates are stacked is explained as an example, and the three polarizing plates are stacked so as to be in contact with each other as shown in FIG. 3A. Of course, a structure in which four or more polarizing plates are stacked may be employed.

On the outer side of the first light-transmitting substrate 101, a first polarizing plate A 111, a second polarizing plate A 112, and a third polarizing plate A 113 are sequentially provided. The first polarizing plate A 111, the second polarizing plate A 112, and the third polarizing plate A 113 are arranged such that a transmission axis A of the first polarizing plate A 111, a transmission axis A of the second polarizing plate A 112, and a transmission axis A of the third polarizing plate A 113 are parallel to each other. In other words, the stacked polarizing plates; the first polarizing plate A 111, the second polarizing plate A 112, and the third polarizing plate A 113; are arranged such that the transmission axes thereof are in a parallel nicol state.

On the outer side of the second light-transmitting substrate 102, a first polarizing plate B 121, a second polarizing plate B 122, and a third polarizing plate B 123 are sequentially provided. The first polarizing plate B 121, the second polarizing plate B 122, and the third polarizing plate B 123 are arranged such that a transmission axis B of the first polarizing plate B 121, a transmission axis B of the second polarizing plate B 122, and a transmission axis B of the third polarizing plate B 123 are parallel to each other. In other words, the stacked polarizing plates; the first polarizing plate B 121, the second polarizing plate B 122, and the third polarizing plate B 123; are arranged such that the transmission axes thereof are in a parallel nicol state.

Furthermore, the transmission axes A of the stacked polarizing plates provided on the first light-transmitting substrate 101 and the transmission axes B of the stacked polarizing plates provided on the second light-transmitting substrate 102 cross at right angles. In other words, the stacked polarizing plates A and the stacked polarizing plates B, which face each other, are arranged such that the transmission axes thereof are in a crossed nicol state.

These polarizing plates can be formed using a known material, and a structure in which an adhesion surface, TAC (triacetylcellulose), a mixed layer of PVA (polyvinyl alcohol) and iodine, and TAC are stacked in this order from the substrate side may be used, for example. The polarization degree can be controlled by the mixed layer of PVA (polyvinyl alcohol) and iodine. The polarizing plate may be referred to as a polarizing film because of its shape.

It is to be noted that the polarizing plate has an absorption axis that is orthogonal to the transmission axis, as a characteristic of the polarizing plate. Therefore, when the absorption axes are parallel to each other, it can be referred to as "parallel nicol".

As described above, three or more polarizing plates are stacked on each side, and the polarizing plates are arranged such that the transmission axes of polarizing plates facing each other are in a crossed nicol state. In this manner as well, light leakage in the transmission axis direction can be reduced. As a result, the contrast ratio of the display device can be improved.

This embodiment mode can be implemented by being freely combined with the description in the other embodiment modes and embodiments in this specification.

Embodiment Mode 4

Figure 4:
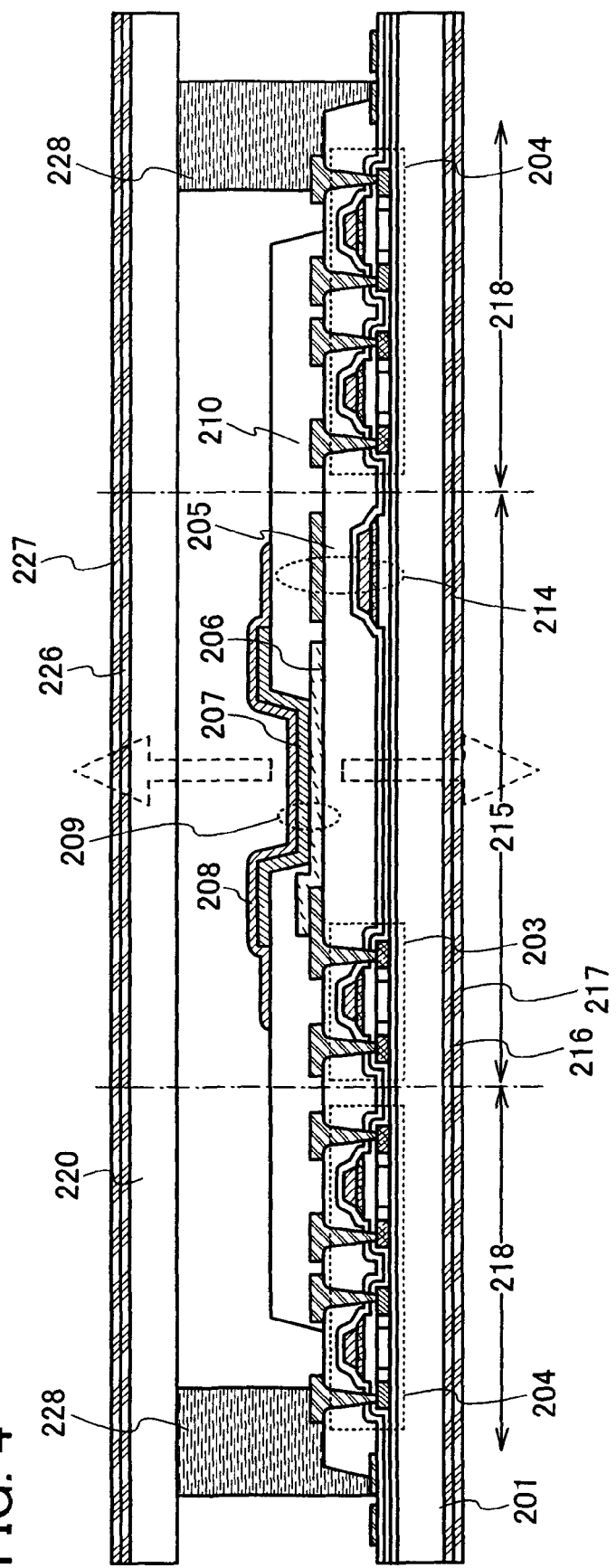
FIG. 4 is a view showing a display device of the present invention.

In this embodiment mode, a cross-sectional view of the display device of the present invention will be described as an example, with reference to FIG. 4.

A thin film transistor is formed over a substrate 201 having an insulating surface (hereinafter referred to as an insulating substrate) 201 with an insulating layer therebetween. The thin film transistor (also referred to as a TFT) includes a semiconductor layer processed into a predetermined shape, a gate insulating layer covering the semiconductor layer, a gate electrode provided over the semiconductor layer with the gate insulating layer therebetween, and a source or drain electrode connected to an impurity layer in the semiconductor layer. A material used for the semiconductor layer is a semiconductor material including silicon, and its crystalline state may be any of an amorphous state, a microcrystalline state, or a crystalline state. As the insulating layer typified by the gate insulating film, an inorganic material is preferably used, and silicon nitride or silicon oxide can be used. The gate electrode, the source electrode, or the drain electrode may be formed using a conductive material, and tungsten, tantalum, aluminum, titanium, silver, gold, molybdenum, copper, or the like may be included. The display device can be mainly divided into a pixel portion 215 and a driver circuit portion 218. A thin film transistor 203 provided in the pixel portion 215 is used as a switching element, and thin film transistors 204 provided in the driver circuit portion are used as a CMOS circuit. A P-channel TFT and an N-channel TFT constitute a CMOS circuit. The thin film transistor 203 can be controlled by the CMOS circuit provided in the driver circuit portion 218.

An insulating layer having a stacked structure or a single-layer structure is formed so as to cover the thin film transistor. The insulating layer can be formed using an inorganic material or an organic material. As the inorganic material, silicon nitride or silicon oxide can be used. As the organic material, polyimide, acrylic, polyamide, polyimide amide, resist, or benzocyclobutene, siloxane, polysilazane may be used. Siloxane has a skeleton structure formed by the bond of silicon (Si) and oxygen (O), in which an organic group containing at least hydrogen (an alkyl group, or aromatic hydrocarbon, for example) is used as a substituent. A fluoro group may be used as a substituent. Alternatively, an organic group containing at least hydrogen and a fluoro group may be used as substituents. Polysilazane is formed using a liquid material containing a polymer material having the bond of silicon (Si) and nitrogen (N), as a starting material. When the inorganic material is used, the surface becomes uneven along the unevenness underneath. When the organic material is used, the surface becomes flat. For example, when flatness is required for an insulating layer 205, the organic material may be used. It is to be noted that flatness can be achieved even when the inorganic material is used, by forming the film thick.

The source or drain electrode is manufactured by forming a conductive layer in an opening provided in the insulating layer 205 or the like. At this time, a conductive layer functioning as a wiring over the insulating layer 205 can be formed. Furthermore, a capacitor element 214 can be formed by the conductive layer of the gate electrode, the insulating layer 205, and the conductive layer of the source or drain electrode.

Then, a first electrode 206 which is connected to either the source or drain electrode is formed. The first electrode 206 is formed using a material having a light-transmitting property. As the material having a light-transmitting property, indium tin oxide (ITO), zinc oxide (ZnO), indium zinc oxide (IZO), zinc oxide added with gallium (GZO), or the like can be given. In addition, an alkali metal such as Li or Cs, an alkaline earth metal such as Mg, Ca, or Sr, an alloy containing these (Mg: Ag, Al: Li, Mg: In, or the like), and a compound of these (calcium fluoride, calcium nitride) may also be used. Furthermore, a material with a non-light-transmitting property such as a rare earth metal, Yb or Er for example, may be used for the first electrode 206, because a light-transmitting property can be obtained by making the film thickness very thin.

An insulating layer 210 is formed so as to cover an edge of the first electrode 206. The insulating layer 210 can be formed in a similar way to the insulating layer 205. An opening is provided in the insulating layer 210 such that the insulating layer 210 covers the edge of the first electrode 206. An edge of the opening may be tapered, so that a breakage of a layer to be formed later can be prevented. When a non-photosensitive resin or a photosensitive resin is used for the insulating layer 210, for example, the side face of the opening can be tapered by an exposure condition.

After that, an electroluminescence layer 207 is formed over the opening of the insulating layer 210. The electroluminescence layer includes layers each having its function, specifically: a hole injecting layer; a hole transporting layer; a light emitting layer; an electron transporting layer; and an electron injecting layer. However, a boundary between each layer is not necessarily clear, and some part thereof may be mixed.

Specific examples of the materials which form a light emitting layer are, when light emission of a red-based color is required, 4-dicyanomethylene-2-isopropyl-6-[2-(1,1,7,7-tetramethyljulolidine-9-yl)ethenyl]-4H-pyran (abbreviation: DCJTI); 4-dicyanomethylene-2-methyl-6-[2-(1,1,7,7-tetramethyljulolidine-9-yl)ethenyl]-4H-pyran (abbreviation: DCJT); 4-dicyanomethylene-2-tert-butyl-6-[2-(1,1,7,7-tetramethyljulolidine-9-yl)ethenyl]-4H-pyran (abbreviation: DCJTB); periflanthene; 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonato) (abbreviation: Ir[Fdpq]$_2$acac), and the like can be used for the light emitting layer. However, the material is not limited to these and a substance which exhibits light emission with a peak of an emission spectrum at 600 to 700 nm can be used.

When light emission of a green-based color is required, N,N'-dimethylquinacridon (abbreviation: DMQd), coumarin 6, coumarin 545T, tris(8-quinolinolato)aluminum (abbreviation: Alq$_3$), or the like can be used for the light emitting layer. However, the material is not limited to these and a substance which exhibits light emission with a peak of an emission spectrum at 500 to 600 nm can be used.

When light emission of a blue-based color is required, 9,10-bis(2-naphthyl)-tert-butylanthracene (abbreviation: t-BuDNA), 9,9'-biantryl, 9,10-diphenylanthracene (abbreviation: DPA), 9,10-bis(2-naphthyl)anthracene (abbreviation: DNA), bis(2-methyl-8-quinolinolato)-4-phenylphenolato-gallium (abbreviation: BGaq), bis(2-methyl-8-quinolinolato)-4-phenylphenolato-aluminum (abbreviation: BAlq), or the like can be used for the light emitting layer. However, the material is not limited to these and a substance which exhibits light emission with a peak of an emission spectrum at 400 to 500 nm can be used.

When light emission of a white-based color is required, TPD (aromatic diamine), 3-(4-tert-butylphenyl)-4-phenyl-5-(4-biphenylyl)-1,2,4-triazole (abbreviation: TAZ), tris(8-quinolinolato)aluminum (abbreviation: Alq$_3$), Alq$_3$ doped with Nile Red which is a red light emission pigment, and Alq$_3$ may be stacked by a vapor deposition method or the like.

After that, a second electrode 208 is formed. The second electrode 208 can be formed in a similar manner to the first electrode 206. In this way, a light emitting element 209 which includes the first electrode 206, the electroluminescence layer 207, and the second electrode 208 can be formed.

At this time, since the first electrode 206 and the second electrode 208 each have a light-transmitting property, light can be emitted from the electroluminescence layer 207 in both directions. Such a display device that can emit light in both directions can be referred to as a dual emission type display device.

After that, the insulating substrate 201 and the counter substrate 220 are attached to each other with a sealing material 228. In this embodiment mode, the sealing material 228 is provided over part of the driver circuit portion 218, so that the frame size can be reduced. Needless to say, arrangement of the sealing material 228 is not limited thereto, and the sealing material 228 may be provided outside of the driver circuit portion 218.

A space formed by attaching the insulating substrate 201 and the counter substrate 220 is filled with an inert gas such as nitrogen. Alternatively, the space is filled with a highly hygroscopic resin material having a light-transmitting property. As a result, moisture and oxygen which cause deterioration of the light emitting element 209 can be prevented from entering. In addition, a spacer may be provided in order to keep a distance between the insulating substrate 201 and the counter substrate 220, and the spacer may be provided with a hygroscopic property. The spacer has a spherical shape or a columnar shape.

A color filter and a black matrix may be provided for the counter substrate 220. By using the color filter, full color display is possible even when a mono-color light emitting layer, a white color light emitting layer for example, is used. In addition, when light emitting layers for RGB are used, a wavelength of the emitted light can be controlled by the color filter, and clear display can be provided. Furthermore, the black matrix can reduce reflection of external light caused by a wiring or the like.

After that, a first polarizing plate A 216 and a second polarizing plate A 217 are provided on the outer side of the insulating substrate 201, and a first polarizing plate B 226 and a second polarizing plate B 227 are provided on the outer side of the counter substrate 220. In other words, stacked polarizing plates are provided on each outer side of the insulating substrate 201 and the counter substrate 220. As a result, the black color can be darkened, and the contrast ratio can be improved.

Although a mode in which the driver circuit portion is formed over the insulating substrate 201 in an integrated manner is shown in this embodiment mode, an IC circuit formed using a silicon wafer may be used for the driver circuit portion. In this case, a picture signal or the like from the IC circuit can be input to the thin film transistor 203 for switching through a connecting terminal or the like.

It is to be noted that, although an active-type display device is used for the explanation in this embodiment mode, stacked polarizing plates can be provided in the case of a passive-type display device as well. As a result, the contrast ratio can be improved.

This embodiment mode can be implemented by being freely combined with the description in the other embodiment modes and embodiments in this specification.

Embodiment Mode 5

In this embodiment mode, a configuration of a display device having a pixel portion and a driver circuit of the present invention will be explained.

Figure 5:
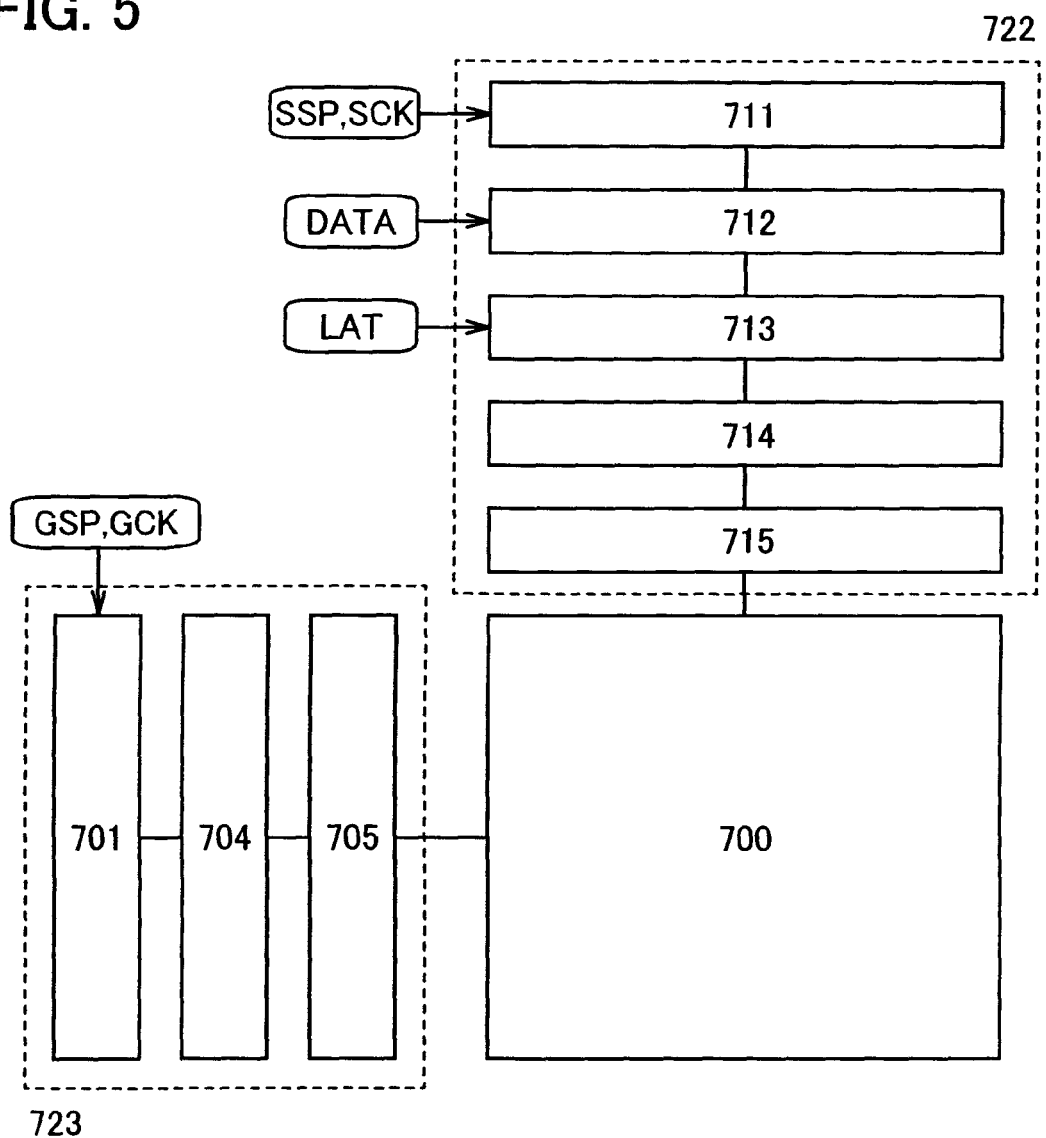
FIG. 5 is a block diagram showing a display device of the present invention.

FIG. 5 shows a block diagram of a state where a scanning line driver circuit 723 and a signal line driver circuit 722 are provided in the periphery of a pixel portion 700.

The pixel portion 700 has a plurality of pixels, and the pixel is provided with a light emitting element and a switching element.

The scanning line driver circuit 723 includes a shift register 701, a level shifter 704, and a buffer 705. A signal is produced based on a start pulse (GSP) and a clock pulse (GCK) input to the shift register 701, and is input to the buffer 705 through the level shifter 704. A signal is amplified in the buffer 705 to be input to the pixel portion 700. The pixel portion 700 is provided with a light emitting element and a switching element which selects a light emitting element, and the signal from the buffer 705 is input to a gate line of the switching element. Accordingly, a switching element of a predetermined pixel is selected.

The signal line driver circuit 722 includes a shift register 711, a first latch circuit 712, a second latch circuit 713, a level shifter 714, and a buffer 715. A start pulse (SSP) and a clock pulse (SCK) are input to the shift register 711. A data signal (DATA) is input to the first latch circuit 712, and a latch pulse (LAT) is input to the second latch circuit 713. The DATA is input to the second latch circuit 713 based on the SSP and the SCK. The DATA for one row is held in the second latch circuit 713 to be input all together to the pixel portion 700.

The signal line driver circuit 722, the scanning line driver circuit 723, and the pixel portion 700 can be formed using semiconductor elements provided over the same substrate. For example, the signal line driver circuit 722, the scanning line driver circuit 723, and the pixel portion 700 can be formed using thin film transistors provided over the insulating substrate explained in the above embodiment mode.

This embodiment mode can be implemented by being freely combined with the description in the other embodiment modes and embodiments in this specification.

Embodiment Mode 6

In this embodiment mode, an equivalent circuit diagram of a pixel included in a display device will be explained with reference to FIGS. 6A to 6C.

Figure 6A:
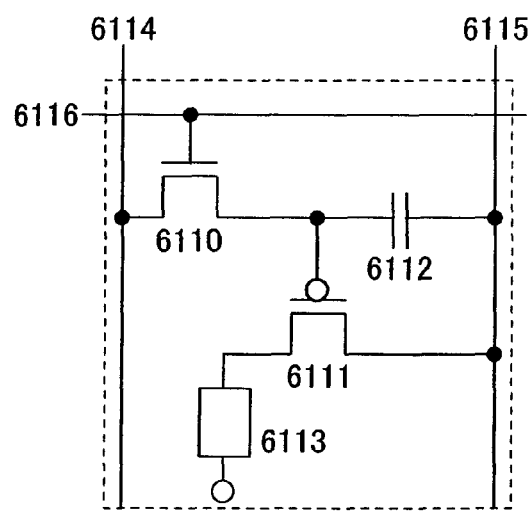
FIGS. 6A to 6C are diagrams each showing a pixel circuit included in a display device of the present invention.

FIG. 6A shows an example of an equivalent circuit diagram of a pixel, which includes a signal line 6114, a power supply line 6115, and a scanning line 6116, and in an intersection region thereof, a light emitting element 6113, transistors 6110 and 6111, and a capacitor element 6112. A picture signal (also referred to as a video signal) is input to the signal line 6114 by a signal line driver circuit. The transistor 6110 can control supply of an electric potential of the picture signal to a gate of the transistor 6111 in accordance with a selection signal input to the scanning line 6116. The transistor 6111 can control supply of a current to the light emitting element 6113 in accordance with an electric potential of the picture signal. The capacitor element 6112 can hold voltage between the gate and a source (referred to as gate-source voltage) of the transistor 6111. Although the capacitor element 6112 is shown in FIG. 6A, the capacitor element 6112 may not be provided when a gate capacitance of the transistor 6111 or other parasitic capacitances can cover the function.

Figure 6B:
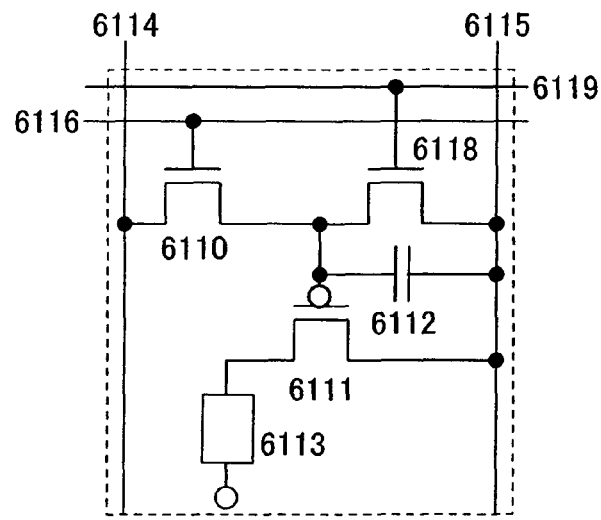

FIG. 6B is an equivalent circuit diagram of a pixel in which a transistor 6118 and a scanning line 6119 are newly provided in the pixel shown in FIG. 6A. The transistor 6118 makes it possible to make the electric potentials of the gate and source of the transistor 6111 equal to each other so that a state where no current flows in the light emitting element 6113 can be forcibly made. Therefore, a sub-frame period can be more shortened than a period during which a picture signal is input to all pixels.

Figure 6C:
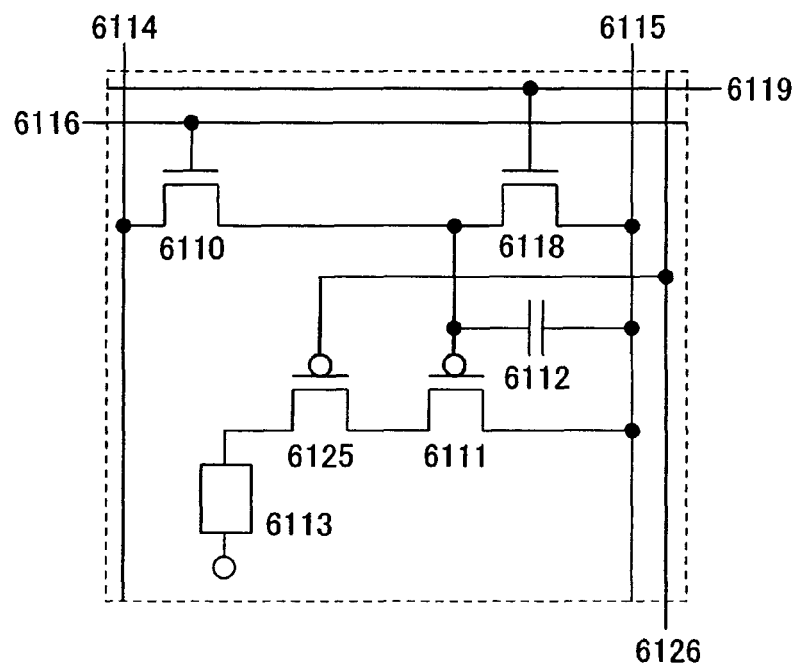

FIG. 6C is an equivalent circuit diagram of a pixel in which a transistor 6125 and a wiring 6126 are newly provided in the pixel shown in FIG. 6B. An electric potential of a gate of the transistor 6125 is fixed by the wiring 6126. The transistor 6111 and the transistor 6125 are connected in series between the power supply line 6115 and the light emitting element 6113. Accordingly, a value of a current supplied to the light emitting element 6113 can be controlled by the transistor 6125, and whether or not the current is supplied to the light emitting element 6113 can be controlled by the transistor 6111.

A pixel circuit included in a display device of the present invention is not limited to the configuration shown in this embodiment mode. For example, a pixel circuit having a current mirror may be employed, having a configuration which conducts analog gradation display.

This embodiment mode can be implemented by being freely combined with the description in the other embodiment modes and embodiments in this specification.

Embodiment Mode 7

Electronic devices according to the present invention include: a television device (also simply referred to as a television or a television receiver), a digital camera, a digital video camera, a cellular phone device (also simply referred to as a cellular phone handset or a cellular phone), a portable information terminal such as a PDA, a portable game machine, a monitor for a computer, a computer, a sound reproducing device such as a car audio set, an image reproducing device provided with a recording medium such as a home game machine, and the like. Specific examples thereof will be explained with reference to FIGS. 7A to 7F.

Figure 7A:
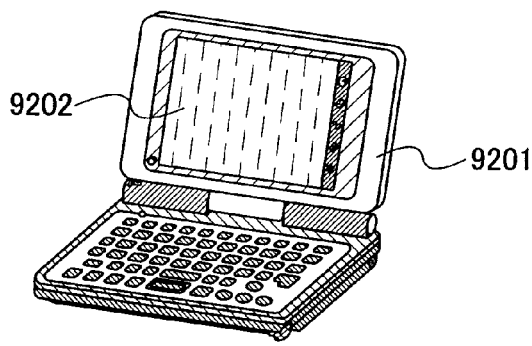
FIGS. 7A to 7F are views each showing an electronic device of the present invention.

A portable information terminal device shown in FIG. 7A includes a main body 9201, a display portion 9202, and the like. A display device of the present invention can be applied to the display portion 9202. As a result, a portable information terminal device with a high contrast ratio can be provided.

Figure 7B:
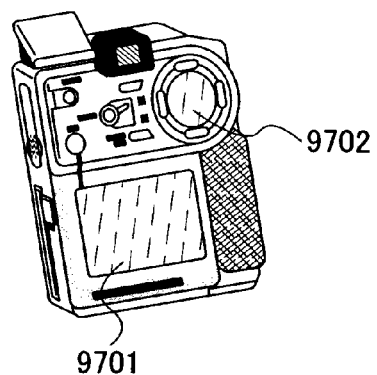

A digital video camera shown in FIG. 7B includes a display portion 9701, a display portion 9702, and the like. The display device of the present invention can be applied to the display portion 9701. As a result, a digital video camera with a high contrast ratio can be provided.

Figure 7C:
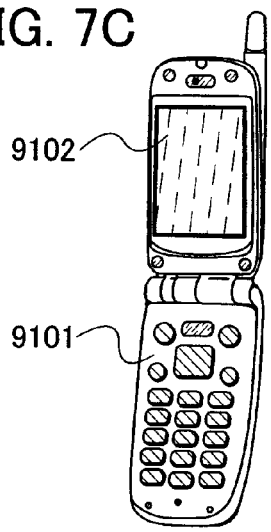

A cellular phone handset shown in FIG. 7C includes a main body 9101, a display portion 9102, and the like. The display device of the present invention can be applied to the display portion 9102. As a result, a cellular phone handset with a high contrast ratio can be provided.

Figure 7D:
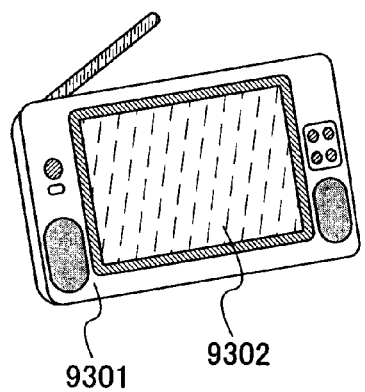

A portable television device shown in FIG. 7D includes a main body 9301, a display portion 9302, and the like. The display device of the present invention can be applied to the display portion 9302. As a result, a portable television device with a high contrast ratio can be provided. Further, the display device of the present invention can be applied to various types of television devices such as a small-sized television device incorporated in a portable terminal such as a cellular phone handset, a medium-sized television device which is portable, and a large-sized television device (for example, 40 inches or more).

Figure 7E:
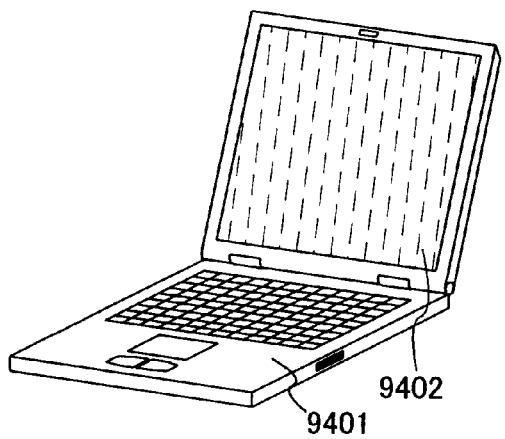

A portable computer shown in FIG. 7E includes a main body 9401, a display portion 9402, and the like. The display device of the present invention can be applied to the display portion 9402. As a result, a portable computer with a high contrast ratio can be provided.

Figure 7F:
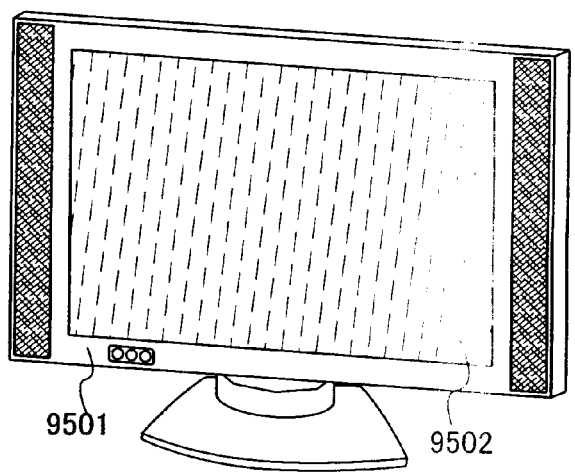

A television device shown in FIG. 7F includes a main body 9501, a display portion 9502, and the like. The display device of the present invention can be applied to the display portion 9502. As a result, a television device with a high contrast ratio can be provided.

As described above, by using the display device of the present invention, an electronic device with a high contrast ratio can be provided.

This embodiment mode can be implemented by being freely combined with the description in the other embodiment modes and embodiments in this specification.

Embodiment 1

In this embodiment, results of optical calculations using stacked polarizing plates will be explained. Defining a contrast ratio as a ratio between white transmittance and black transmittance (white transmittance/black transmittance), the black transmittance and the white transmittance were calculated respectively and then the contrast ratio was obtained.

Figure 8:
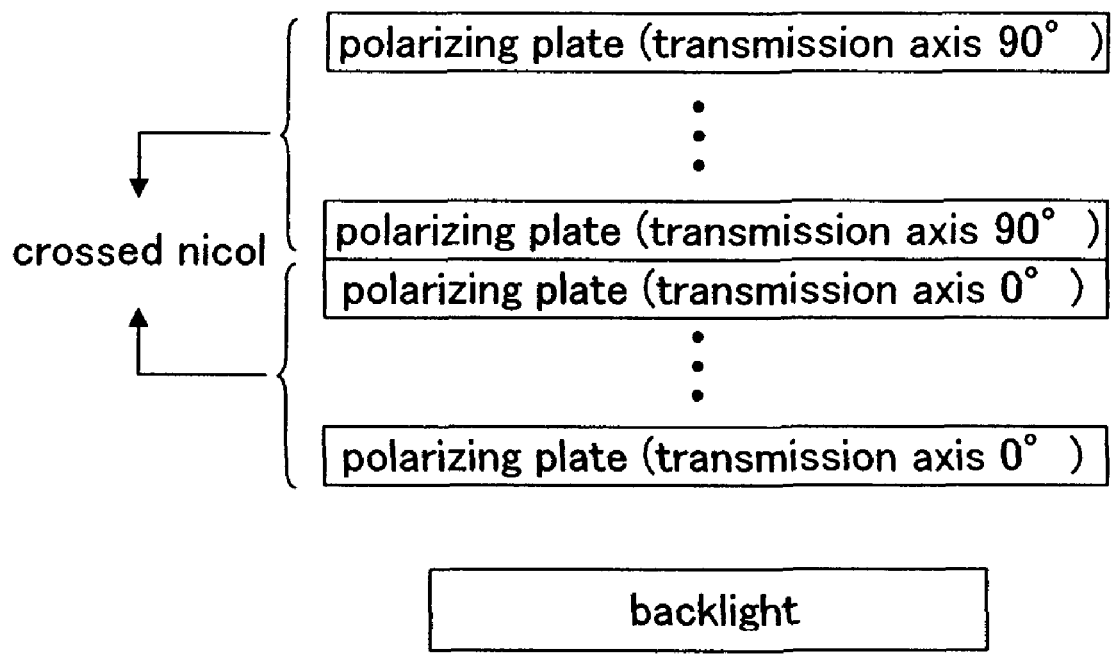
FIG. 8 is a view showing a measurement system of black transmittance of Embodiments.

An optical system for the black transmittance is shown in FIG. 8. Since the black display of an electroluminescence element is a non-lighting state, a first light-transmitting substrate and a second light-transmitting substrate including a light emitting layer of the electroluminescence element are not provided between polarizing plates arranged in a crossed nicol state. In addition, a backlight is placed in place of external light on the side from which external light enters at the time of the non-lighting state. As for the arrangement of the transmission axes of the polarizing plates, two sets of polarizing plates facing each other are arranged such that their transmission axes are in a crossed nicol state, and stacked polarizing plates are in a parallel nicol state, as shown in FIG. 8. In the optical system structured in this manner, the transmittance of light from the backlight, on a viewing side that is opposite to the backlight, was calculated as the black transmittance. At this time, the black transmittance was calculated while changing the number of polarizing plates to be stacked.

Figure 9:
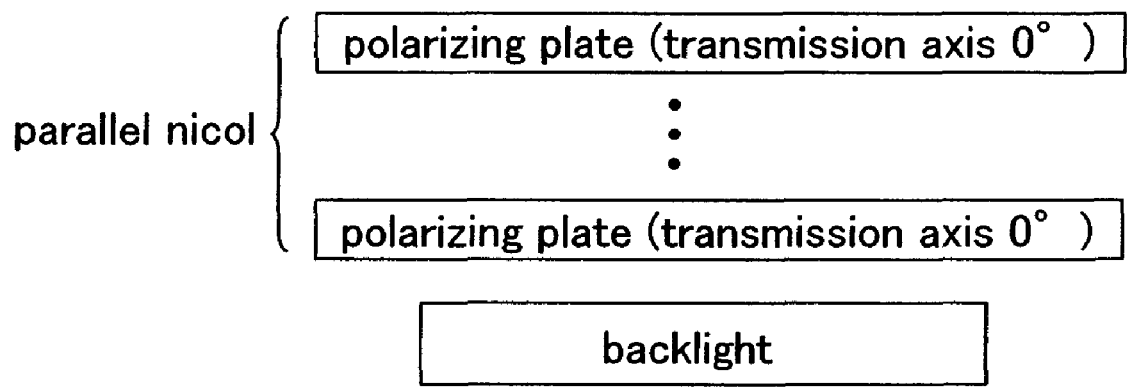
FIG. 9 is a view showing a measurement system of white transmittance of Embodiments.

An optical system for the white transmittance is shown in FIG. 9. A backlight is used in place of light emission from an electroluminescence element. Therefore, polarizing plates are not arranged in a crossed nicol state, but placed on the backlight, as shown in FIG. 9. The polarizing plates are stacked in a parallel nicol state. In the optical system structured in this manner, the transmittance of light from the backlight, on a viewing side that is opposite to the backlight, was calculated as the white transmittance. At this time, the white transmittance was calculated while changing the number of polarizing plates.

Calculation in this embodiment was performed using an optical calculation simulater for liquid crystal LCD MASTER (manufactured by SHINTECH, Inc). In performing optical calculation of transmittance with respect to a wavelength using the LCD MASTER, the optical calculation was performed using optical calculation algorithm having 2×2 matrix in which multiple interaction between elements was not considered, while a light source wavelength was set to be from 380 to 780 nm at intervals of 10 nm. As the polarizing plate, a polarizing plate was used, in which, at a wavelength of 550 nm, n' and n" of the transmission axis were such that n'=1.5 and n"=3.22e−5, respectively, and n' and n" of the absorption axis were such that n'=1.5 and n"=2.21e−3, respectively, provided that a refractive index n was n'+in". The thickness of the polarizing plate was 180 μm. A D65 light source was used for the backlight, and mixed circularly polarization was employed for a polarizing state.

Figure 10A:
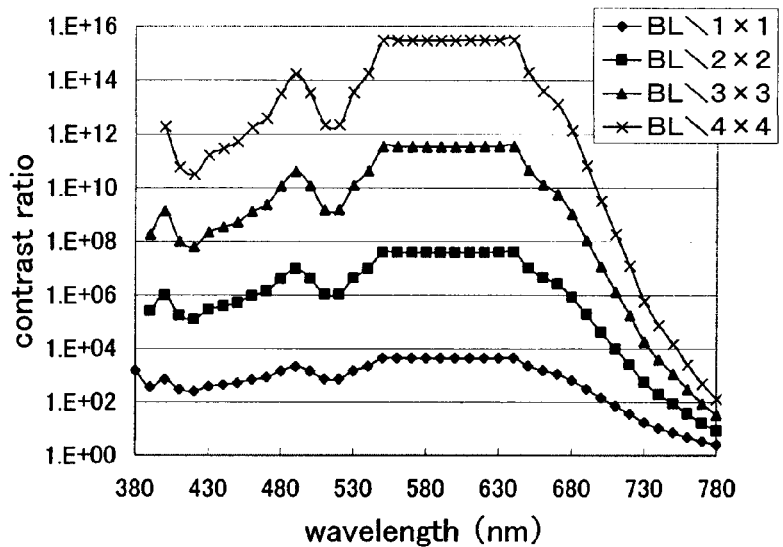
FIGS. 10A to 10C are graphs each showing measurement results of Embodiment 1.
Figure 10B:
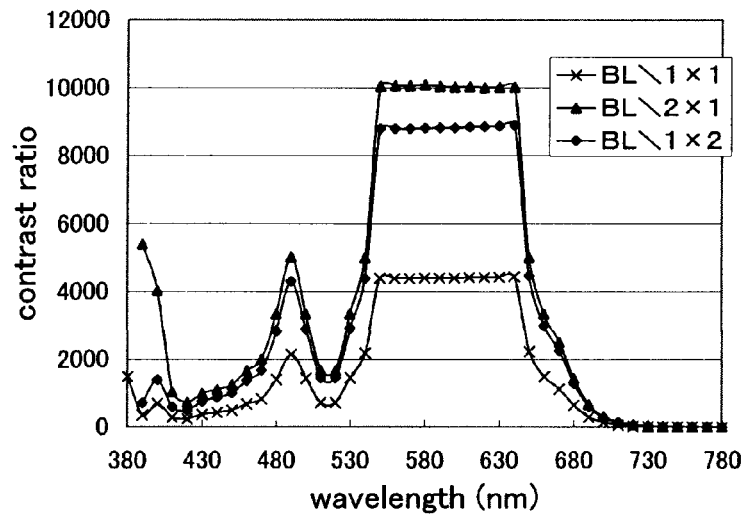
Figure 10C:
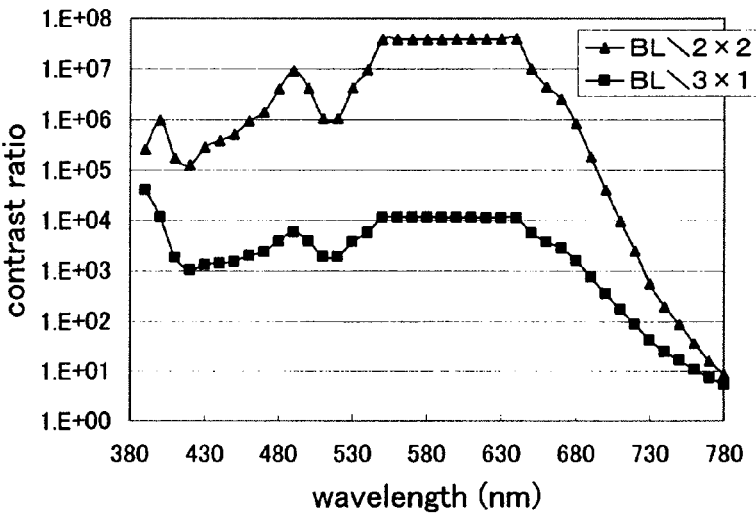

FIGS. 10A to 10C show calculation results of contrast ratio when the number of polarizing plates was changed. "BL\2×1" in the graph means that a calculation result of the black transmittance, in the case where the number of polarizing plates on the backlight (BL) side is two and the number of polarizing plates on the viewing side is one in FIG. 8, is used. Similarly, "BL\1×1", "BL\2×2", "BL\1×2", "BL\3×1" or the like refers to an arrangement of: a backlight; the number of polarizing plates on the backlight side; and the number of polarizing plates on the viewing side.

Furthermore, "BL\2×1" in the graph means that a calculation result of the white transmittance, in the case where the number of polarizing plates is one in FIG. 9, is used. The last numeral indicates the number of polarizing plates for the white transmittance. Similarly, the last numeral in each of "BL\1×1", "BL\2×2", "BL\1×2", "BL\3×1", and the like indicates the number of polarizing plates for the white transmittance.

Regarding a ratio between the white transmittance that is the transmittance of the sample arranged as shown in FIG. 9 and the black transmittance that is the transmittance of the sample arranged as shown in FIG. 8 (white transmittance/black transmittance) as a contrast ratio, calculations were performed to obtain the contrast ratio.

FIG. 10A shows that the contrast ratio is increased as the number of polarizing plates is increased one by one on each side. FIG. 10B shows that the contrast ratio is increased even if the number of polarizing plates is increased just by one on one side. Structures each having the same total number of polarizing plates but having the different number of polarizing plates on either the backlight side or the viewing side, like "BL\1×2" and "BL\2×1", are compared. The result is that the white transmittance is higher in the structure having less polarizing plates on the viewing side than in the structure having more polarizing plates on the viewing side, while their black transmittances are the same. Therefore, a contrast ratio is increased when the viewing side has the smaller number of polarizing plates than the backlight side. FIG. 10C shows that the contrast ratio is increased, in structures each having the same total number of polarizing plates, like "BL\2×2" and "BL\3×1", when the number of polarizing plates on each side is 2 or more.

From these results, it is found that light leakage can be reduced and the contrast ratio can be improved by arranging polarizing plates such that the transmission axes of the stacked polarizing plates are in a parallel nicol state. It is also found that, when the number of polarizing plates is odd, the contrast ratio is increased when the number of polarizing plates on the viewing side is smaller than that on the backlight side. In addition, it is found that the contrast ratio is increased, in structures each having the same total number of polarizing plates, when the number of polarizing plates on each side is 2 or more.

Embodiment 2

In this embodiment, results of optical calculations of Embodiment 1 performed while increasing the number of polarizing plates on each side will be explained.

Figure 11:
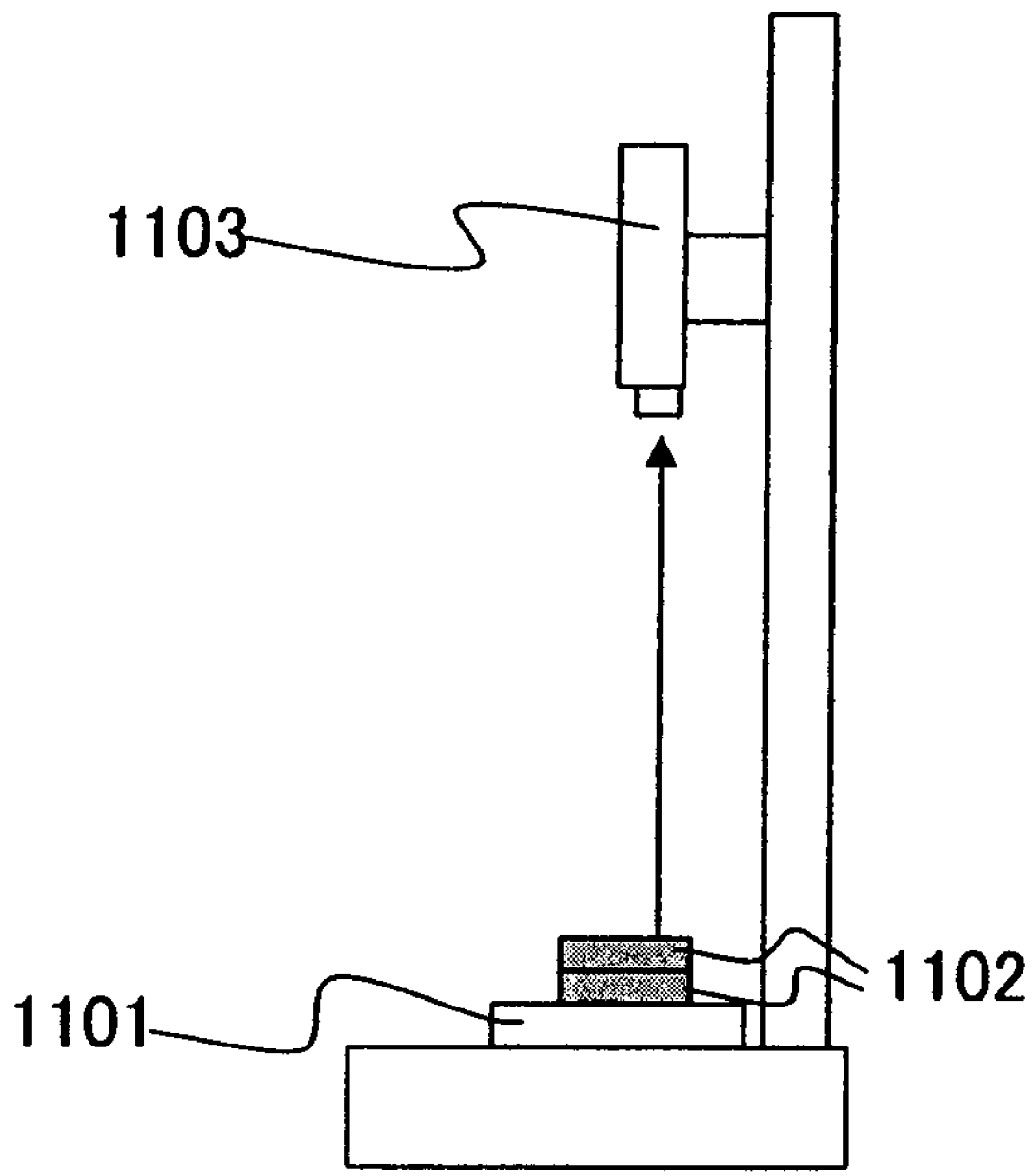
FIG. 11 is a view showing a measurement system of Embodiment 2.

A measurement system which was actually used for the measurement is shown in FIG. 11. As shown in FIG. 11, polarizing plates 1102 are placed on a backlight 1101, and transmitted light was measured by a color luminance meter 1103 (manufactured by TOPCON TECHNOHOUSE CORPORATION, BM-5A).

For the optical system for measurement of black luminance, two sets of polarizing plates facing each other are arranged in a crossed nicol state on the backlight, and transmission axes of the stacked polarizing plates are arranged in a parallel nicol state, as shown in FIG. 8. And the luminance which is obtained by measuring transmitted light intensity on the viewing side by the color luminance meter, changing the number of polarizing plates, is set to be the black luminance.

The optical system for measurement of white luminance is shown in FIG. 9. Transmission axes of polarizing plates stacked on a backlight are in a parallel nicol state, and the luminance which is obtained by measuring transmitted light intensity on the viewing side by the color luminance meter, changing the number of polarizing plates, is set to be the white luminance. Then, regarding a ratio between the white luminance and the black luminance (white luminance/black luminance) as a contrast ratio, calculations were performed to obtain the contrast ratio.

As the polarizing plate, NPF-EG1425DU (manufactured by NITTO DENKO CORPORATION) was used. The polarizing plates were stacked being attached to a glass substrate. It is to be noted that the transmittance of the glass substrate is high, and the results of this experiment are considered to be not affected by the glass substrate.

Figure 12A:
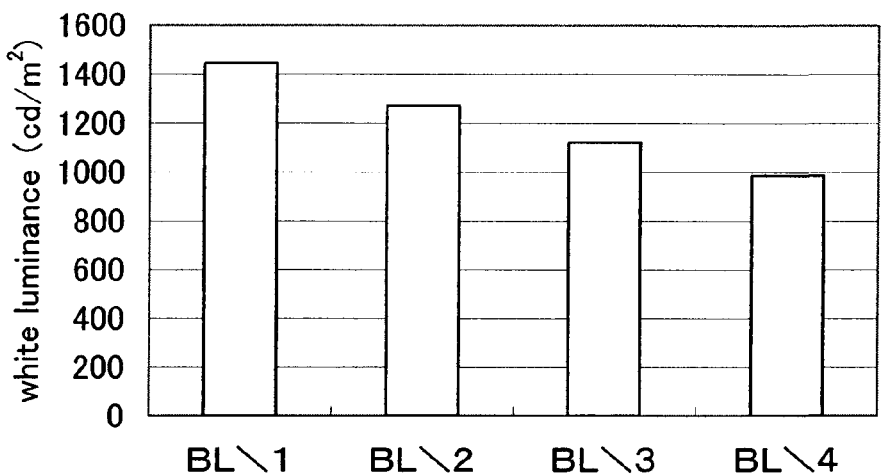
FIGS. 12A to 12C are graphs each showing measurement results of Embodiment 2.
Figure 12B:
Figure 12C:
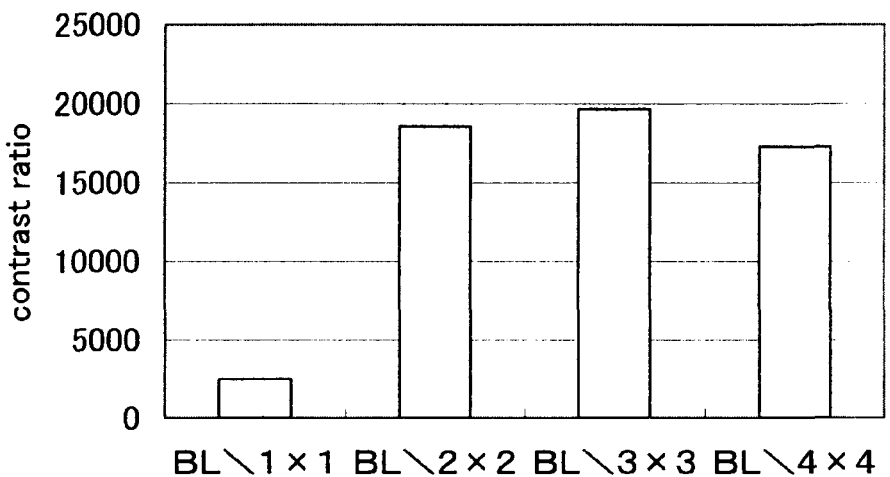

FIG. 12A shows the measurement results of the white luminance; FIG. 12B, the measurement results of the black luminance; and FIG. 12C, the results of the contrast ratio. In FIG. 12A, "BL\2" means that two polarizing plates are arranged on a backlight (BL) such that their transmission axes are parallel. In FIGS. 12B and 12C, "BL\2×2" means that two polarizing plates (as indicated by the first numeral) are arranged on a backlight (BL) in a parallel nicol state, another two polarizing plates (as indicated by the last numeral) facing the aforementioned two polarizing plates are arranged in a parallel nicol state, and the two sets of polarizing plates facing each other are arranged in a crossed nicol state. Therefore, the white luminance used for the calculations for FIG. 12C is the white luminance obtained when the number of polarizing plates is equal to the last numeral.

FIG. 12A shows that the white luminance is gradually decreased as the number of polarizing plates is increased one by one. On the other hand, the black luminance shown in FIG. 12B is drastically decreased as the number of polarizing plates is increased from "BL\1×" to "BL\2×2", and the luminance of "BL\3×3" and the luminance of "BL\4×4" are almost the same although slightly decreased compared to "BL\2×2". Accordingly, it is found that the contrast ratio becomes higher when the number of polarizing plates is increased to "BL\2×2", "BL\3×3" and "BL\4×4" than "BL\1×1" as shown in FIG. 12C. However, a reduction rate of the black luminance is smaller than a reduction rate of the white luminance in the case of "BL\4×4", compared to "BL\3×3"; therefore, the contrast ratio becomes lower.

In other words, comparing FIG. 12A and FIG. 12B, decrease in black luminance is much more significant than decrease in white luminance due to the increase in the number of polarizing plates to be stacked. Therefore, as shown in FIG. 12C, the contrast ratio of a structure in which a plurality of polarizing plates are stacked is high. This result is different from the expectation that using a plurality of polarizing plates decreases the white luminance and the black luminance both and that it makes little difference in increase and decrease of the contrast ratio. In the present invention, difference in degree between the decrease in white luminance and the decrease in black luminance due to the provision of a plurality of polarizing plates is extremely large, which results in improvement in contrast ratio.

As described above, it is found that the contrast ratio increases as the number of polarizing plates is increased one by one on each side. However, comparing "BL\3×3" and "BL\4×4", the contrast ratio of "BL\3×3" is higher than that of "BL\4×4", which means that the contrast ratio is saturated when three polarizing plates are provided on each side.

In this manner, when polarizing plates facing each other are in a crossed nicol state and stacked polarizing plates are arranged such that their transmission axes are in a parallel nicol state, light leakage can be reduced, compared to the case where a pair of polarizing plates with a single-layer structure are arranged in a crossed nicol state. As a result, a contrast ratio of a light emitting device can be improved. In addition, the number of polarizing plates to be stacked is preferably three.

This application is based on Japanese Patent Application serial No. 2005-369537 filed in Japan Patent Office on Dec. 22, 2005, the entire contents of which are hereby incorporated by reference.

EXPLANATION OF REFERENCE

100: layer having electroluminescence element, 101: first light-transmitting substrate, 102: second light-transmitting substrate, 111: first polarizing plate A, 112: second polarizing plate A, 113: third polarizing plate A, 121: first polarizing plate B, 122: second polarizing plate B, 123: third polarizing plate B, 201: insulating substrate, 203: thin film transistor, 204: thin film transistor, 205: insulating layer, 206: electrode, 207: electroluminescence layer, 208: electrode, 209: light emitting element, 210: insulating layer, 214: capacitor element, 215: pixel portion, 216: first polarizing plate A, 217: second polarizing plate A, 218: driver circuit portion, 220: counter substrate, 226: first polarizing plate B, 227: second polarizing plate B, 228: sealing material, 700: pixel portion, 701: shift resistor, 704: level shifter, 705: buffer, 711: shift resistor, 712: latch circuit, 713: latch circuit, 714: level shifter, 715: buffer, 722: signal line driver circuit, 723: scanning line driver circuit, 1101: backlight, 1102: polarizing plate, 1103: color luminance meter, 6110: transistor, 6111: transistor, 6112: capacitor element, 6113: light emitting element, 6114: signal line, 6115: power supply line, 6116: scanning line, 6118: transistor, 6119: scanning line, 6125: transistor, 6126: wiring, 9101: main body, 9102: display portion, 9201: main body, 9202: display portion, 9301: main body, 9302: display portion, 9401: main body, 9402: display portion, 9501: main body, 9502: display portion, 9701: display portion, 9702: display portion

The invention claimed is:

1. A display device comprising:
   a first light-transmitting substrate;

a second light-transmitting substrate;
a transistor over the first light-transmitting substrate;
a light emitting element including a first electrode and a second electrode with a light emitting layer interposed therebetween, wherein the light emitting element is interposed between the first light-transmitting substrate and the second light-transmitting substrate, wherein the light emitting element emits light to both a first light-transmitting substrate side and a second light-transmitting substrate side, and wherein the first electrode is electrically connected to the transistor;
at least first and second stacked linear polarizing plates, wherein the first light-transmitting substrate is interposed between the light emitting element and the at least first and second stacked linear polarizing plates; and
at least third and fourth stacked linear polarizing plates, wherein the second light-transmitting substrate is interposed between the light emitting element and the at least third and fourth stacked linear polarizing plates,
wherein the first and second stacked linear polarizing plates are provided directly in contact with each other through an adhesion surface of the second stacked linear polarizing plate, and
wherein the third and fourth stacked linear polarizing plates are provided directly in contact with each other through an adhesion surface of the fourth stacked linear polarizing plate.

2. A display device according to claim 1, wherein the light emitting element is an electroluminescence element.

3. An electronic device including the display device according to claim 1.

4. A display device comprising:
a first light-transmitting substrate;
a second light-transmitting substrate;
a transistor over the first light-transmitting substrate;
a light emitting element including a first electrode and a second electrode with a light emitting layer interposed therebetween, wherein the light emitting element is interposed between the first light-transmitting substrate and the second light-transmitting substrate, wherein the light emitting element emits light to both a first light-transmitting substrate side and a second light-transmitting substrate side, and wherein the first electrode is electrically connected to the transistor;
at least first and second stacked linear polarizing plates, wherein the first light-transmitting substrate is interposed between the light emitting element and the at least first and second stacked linear polarizing plates; and
at least third and fourth stacked linear polarizing plates, wherein the second light-transmitting substrate is interposed between the light emitting element and the at least third and fourth stacked linear polarizing plates,
wherein the at least first and second linear polarizing plates are arranged such that transmission axes thereof are in a parallel nicol state, and
wherein the at least third and fourth linear polarizing plates are arranged such that transmission axes thereof are in a parallel nicol state,
wherein the first and second stacked linear polarizing plates are provided directly in contact with each other through an adhesion surface of the second stacked linear polarizing plate, and
wherein the third and fourth stacked linear polarizing plates are provided directly in contact with each other through an adhesion surface of the fourth stacked linear polarizing plate.

5. A display device according to claim 4, wherein the light emitting element is an electroluminescence element.

6. An electronic device including the display device according to claim 4.

7. A display device comprising:
a first light-transmitting substrate;
a second light-transmitting substrate;
a transistor over the first light-transmitting substrate;
a light emitting element including a first electrode and a second electrode with a light emitting layer interposed therebetween, wherein the light emitting element is interposed between the first light-transmitting substrate and the second light-transmitting substrate, wherein the light emitting element emits light to both a first light-transmitting substrate side and a second light-transmitting substrate side, and wherein the first electrode is electrically connected to the transistor;
at least first and second stacked linear polarizing plates, wherein the first light-transmitting substrate is interposed between the light emitting element and the at least first and second stacked linear polarizing plates; and
at least third and fourth stacked linear polarizing plates, wherein the second light-transmitting substrate is interposed between the light emitting element and the at least third and fourth stacked linear polarizing plates,
wherein the at least first and second linear polarizing plates are arranged such that transmission axes thereof are in a parallel nicol state,
wherein the at least third and fourth linear polarizing plates are arranged such that transmission axes thereof are in a parallel nicol state, and
wherein the transmission axes of the at least first and second stacked linear polarizing plates are in a crossed nicol state relative to the transmission axes of the at least third and fourth stacked linear polarizing plates,
wherein the first and second stacked linear polarizing plates are provided directly in contact with each other through an adhesion surface of the second stacked linear polarizing plate, and
wherein the third and fourth stacked linear polarizing plates are provided directly in contact with each other through an adhesion surface of the fourth stacked linear polarizing plate.

8. A display device according to claim 7, wherein the light emitting element is an electroluminescence element.

9. An electronic device including the display device according to claim 7.

10. A display device comprising:
a first light-transmitting substrate;
a second light-transmitting substrate;
a transistor over the first light-transmitting substrate;
a light emitting element including a first electrode and a second electrode with a light emitting layer interposed therebetween, wherein the light emitting element is interposed between the first light-transmitting substrate and the second light-transmitting substrate, wherein the light emitting element emits light to both a first light-transmitting substrate side and a second light-transmitting substrate side, and wherein the first electrode is electrically connected to the transistor;
at least first and second stacked linear polarizing plates, wherein the first light-transmitting substrate is interposed between the light emitting element and the at least first and second stacked linear polarizing plates; and
a third linear polarizing plate, wherein the second light-transmitting substrate is interposed between the light-emitting element and the third linear polarizing plate, wherein the at least first and second stacked linear polarizing plates are arranged such that transmission axes thereof are in a parallel nicol state, and wherein the transmission axes of the at least first and second stacked linear polarizing plates are in a crossed nicol state relative to a transmission axis of the third linear polarizing plate, wherein the first and second stacked linear polarizing plates are provided directly in contact with each other through an adhesion surface of the second stacked linear polarizing plate.

11. A display device according to claim 10, wherein the light emitting element is an electroluminescence element.

12. An electronic device including the display device according to claim 10.

13. A display device according to claim 1, each of the first, second, third and fourth linear polarizing plates comprises a mixed layer of polyvinyl alcohol and iodine.

14. A display device according to claim 4, each of the first, second, third and fourth linear polarizing plates comprises a mixed layer of polyvinyl alcohol and iodine.

15. A display device according to claim 7, each of the first, second, third and fourth linear polarizing plates comprises a mixed layer of polyvinyl alcohol and iodine.

16. A display device according to claim 10, each of the first, second and third linear polarizing plates comprises a mixed layer of polyvinyl alcohol and iodine.

17. A display device according to claim 1, wherein the transistor is a thin film transistor.

18. A display device according to claim 4, wherein the transistor is a thin film transistor.

19. A display device according to claim 7, wherein the transistor is a thin film transistor.

20. A display device according to claim 10, wherein the transistor is a thin film transistor.

* * * * *